ced Examiner.

United States Patent
Nakamura

(10) Patent No.: US 7,816,060 B2
(45) Date of Patent: Oct. 19, 2010

(54) MANUFACTURING METHOD OF SEMICONDUCTOR DEVICE, RETICLE CORRECTING METHOD, AND RETICLE PATTERN DATA CORRECTING METHOD

(75) Inventor: Hiroko Nakamura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 889 days.

(21) Appl. No.: 11/717,058

(22) Filed: Mar. 13, 2007

(65) Prior Publication Data

US 2007/0218673 A1  Sep. 20, 2007

(30) Foreign Application Priority Data

Mar. 15, 2006  (JP) .............................. 2006-071244

(51) Int. Cl.
*G03F 9/00*  (2006.01)
*G03C 5/00*  (2006.01)

(52) U.S. Cl. ............................... 430/5; 430/22; 430/30; 430/312

(58) Field of Classification Search ..................... 430/5, 430/22, 30, 312
See application file for complete search history.

(56) References Cited

U.S. PATENT DOCUMENTS 6,664,011 B2    12/2003  Lin et al.
2005/0196684 A1  9/2005  Nakamura et al.

FOREIGN PATENT DOCUMENTS

JP    2005-275386    10/2005

OTHER PUBLICATIONS

B.J. Lin, "Semiconductor Foundry, Lithography, and Patterns", Proceedings of SPIE vol. 4688, pp. 11-24 (2002).
C. Chang, et al., "Low Proximity Contact Holes Formation by Using Double Exposure Technology (DET)", Proceedings of SPIE vol. 5040, pp. 1241-1246 (2003).

*Primary Examiner*—Christopher G Young
(74) *Attorney, Agent, or Firm*—Finnegan, Henderson, Farabow, Garrett & Dunner, L.L.P.

(57) ABSTRACT

A manufacturing method of a semiconductor device including a pattern forming method, a reticle correcting method, and a reticle pattern data correcting method are disclosed. According to one aspect of the present invention, there is provided a manufacturing method of a semiconductor device, comprising forming a pattern composed of photosensitive resin film including forming periodically arranged first contact hole patterns of a first photosensitive resin film on a processing film formed above a semiconductor substrate, and forming a selective opening pattern of a second photosensitive resin film including various opening pattern types on the first photosensitive resin film, whereby selectively forming second contact hole patterns at positions of the first contact hole patterns selected by the selective opening patterns, wherein the first contact hole patterns have corrected dimensions such that dimensions of the second contact hole patterns become equivalent each other independent of the opening pattern types.

20 Claims, 14 Drawing Sheets

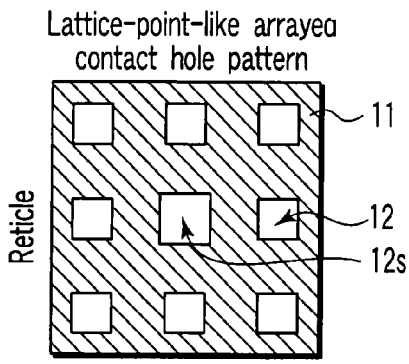
FIG. 4A Lattice-point-like arrayed contact hole pattern
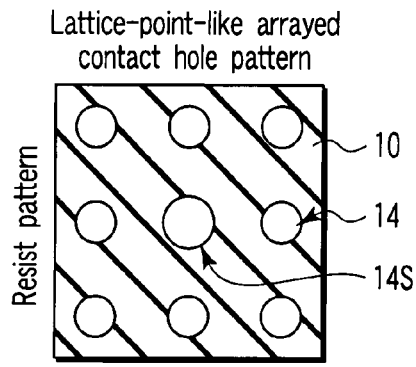
FIG. 4B Lattice-point-like arrayed contact hole pattern
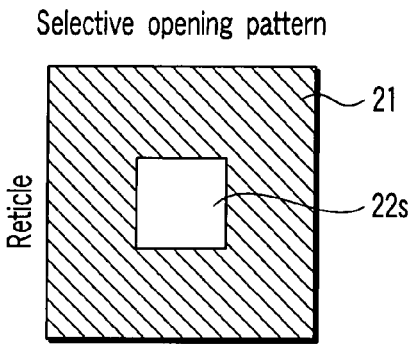
FIG. 4C Selective opening pattern
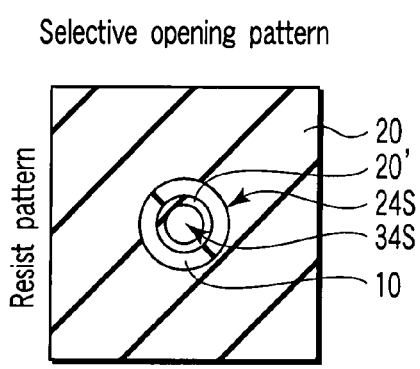
FIG. 4D Selective opening pattern
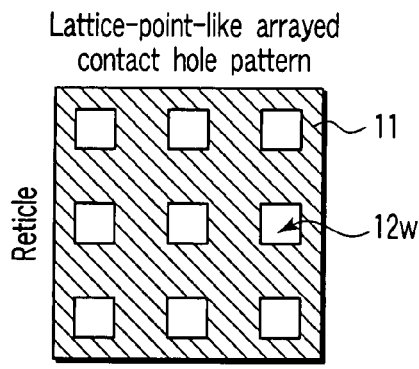
FIG. 5A Lattice-point-like arrayed contact hole pattern
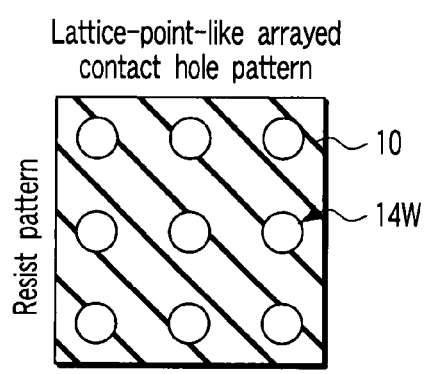
FIG. 5B Lattice-point-like arrayed contact hole pattern
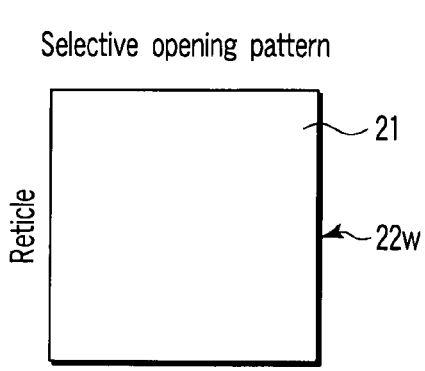
FIG. 5C Selective opening pattern
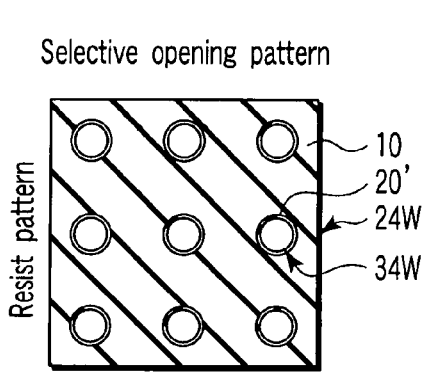
FIG. 5D Selective opening pattern

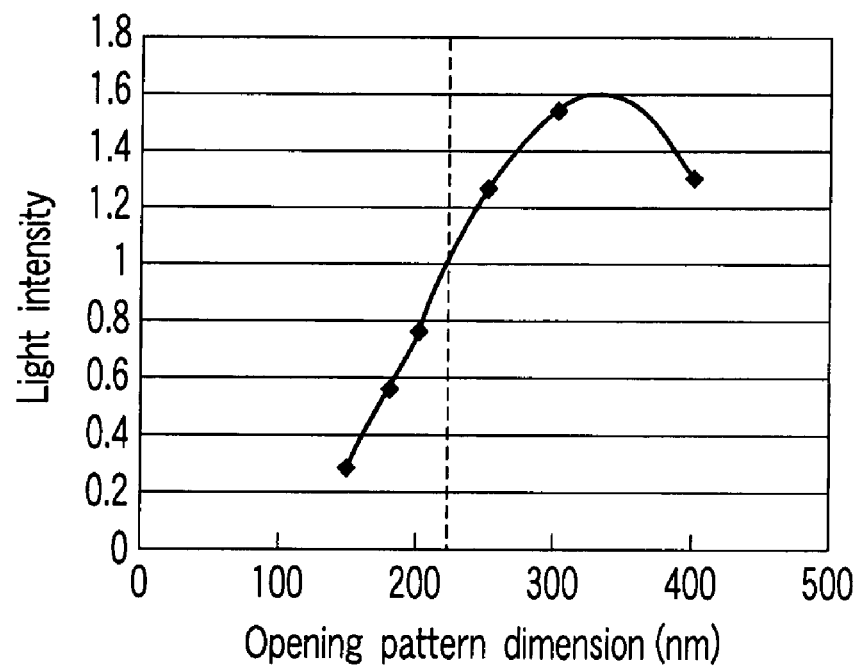
F I G. 12
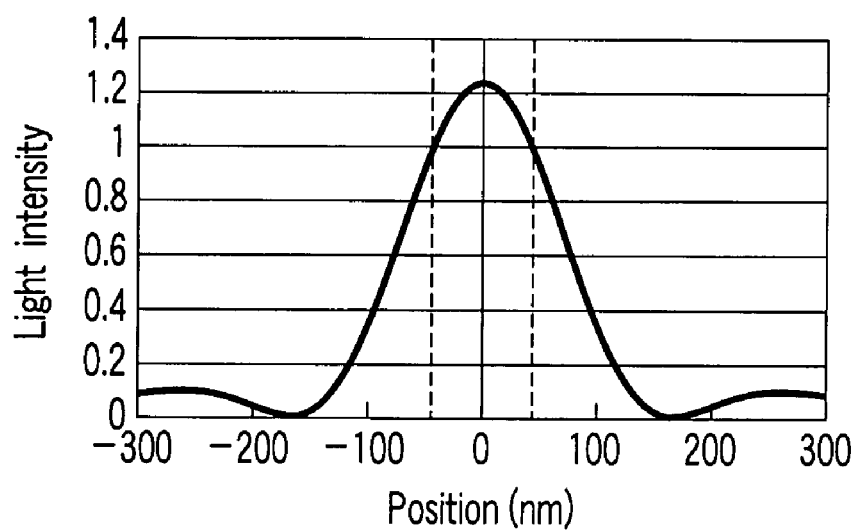
F I G. 13

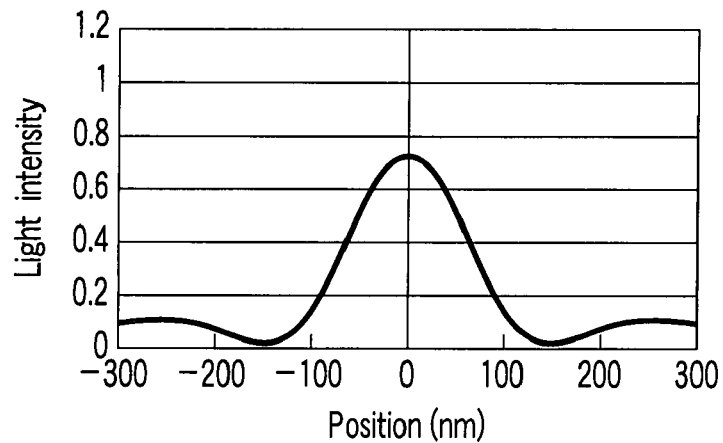
F I G. 15A
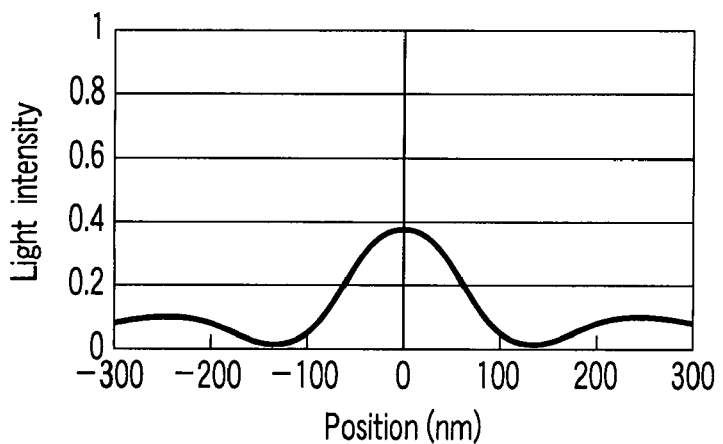
F I G. 15B
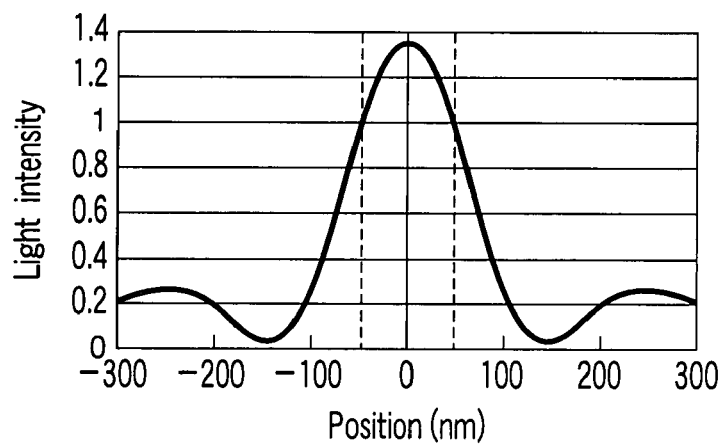
F I G. 15C

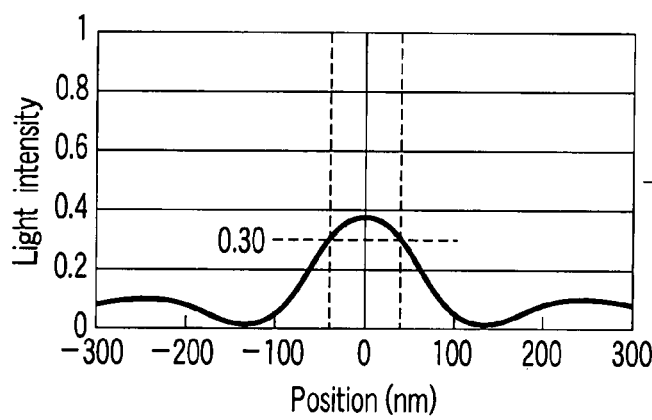
F I G. 17A
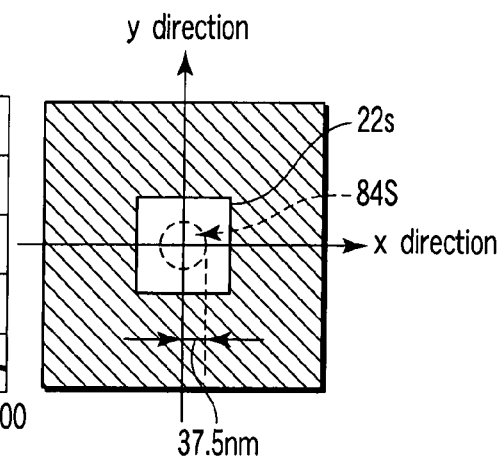
F I G. 17B
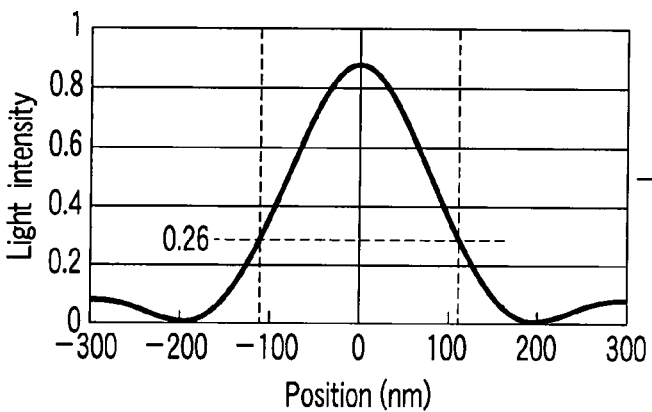
F I G. 17C
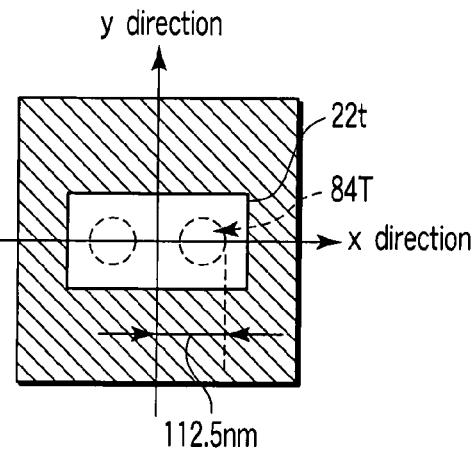
F I G. 17D
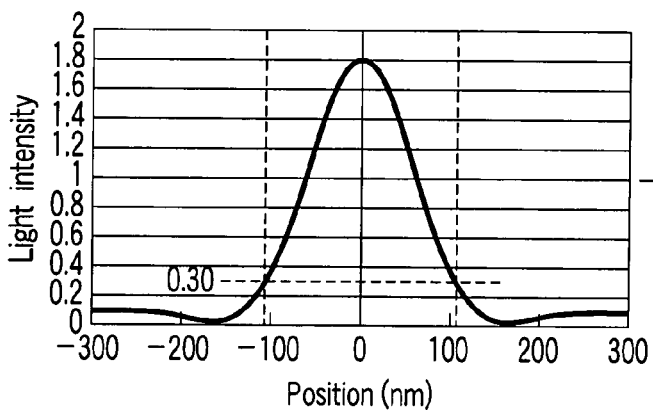
F I G. 17E
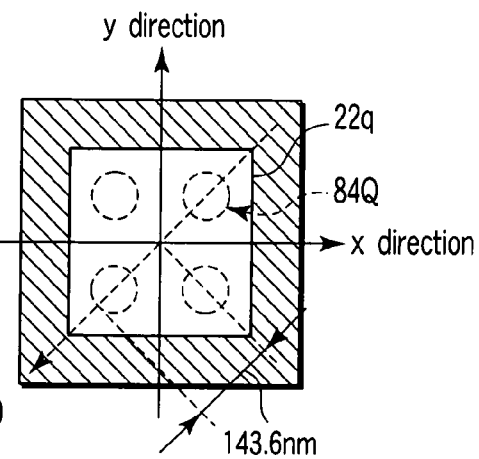
F I G. 17F

MANUFACTURING METHOD OF SEMICONDUCTOR DEVICE, RETICLE CORRECTING METHOD, AND RETICLE PATTERN DATA CORRECTING METHOD

CROSS-REFERENCE TO RELATED APPLICATIONS

This application is based upon and claims the benefit of priority from prior Japanese Patent Application No. 2006-071244, filed Mar. 15, 2006, the entire contents of which are incorporated herein by reference.

BACKGROUND OF THE INVENTION

1. Field of the Invention

The present invention relates to a manufacturing method of a semiconductor device, and more particularly to a pattern forming method, a reticle correcting method, and reticle pattern data correcting method for a lithography process.

2. Description of the Related Art

With miniaturization of a semiconductor device, forming randomly arranged fine patterns, e.g., contact holes, has become difficult by a conventional lithography technology. That is because, comparing a pattern without periodic properties with a periodic pattern, a resolution of lithography is lower and a process margin is also narrower in the pattern without periodic properties.

A method of forming randomly arranged contact hole patterns is disclosed, for example, in a specification of U.S. Pat. No. 6,664,011B2, "Semiconductor Foundry, Lithography, and Patterns", Proceedings of SPIE 4688, pp. 31-44, 2002, by B. J. Lin, and "Low Proximity Contact Holes Formation by Using Double Exposure Technology (DET)", Proceedings of SPIE, Vol. 5040, pp. 1241-1246, 2003, by C. Chang et. al. The disclosed method is called a pack and cover process. FIGS. 1A and 1B are views for explaining the pack and cover process, in which FIG. 1A is a plan view and FIG. 1B is a cross-sectional view. As depicted in the drawings, according to this method, photosensitive resin films 10 and 20 (which will be referred to as resist films, hereinafter) doubly formed on a processing film 5 provided above a semiconductor substrate 1 are used to form fine contact hole patterns 34 in a desired arrangement on the processing film 5.

Specifically, first, periodic fine contact hole patterns 14 composed of the first resist film 10 are formed on the processing film 5. That is because periodic patterns have advantages as compared with random patterns. One of the advantages is that a pattern having a smaller dimension can be formed with a wider focus margin. Then, the second resist film 20 is formed on the entire surface of the first resist film 10, and a selective opening resist pattern 24 to open only desired contact holes is formed. In this manner, the randomly arranged desired fine contact hole patterns 34 can be opened.

In reality, however, when the second resist film 20 is formed, the first periodic contact hole pattern 14 is filled with the second resist film 20. When the selective opening resist pattern 24 composed of the second resist film 20 is formed in such a state, as shown in FIGS. 1A and 1B, a part of the second resist film 20' may remain on an inner wall of the periodic contact hole pattern 34 at the time of development of the selective opening resist pattern 24. Therefore, a final dimension of the contact hole pattern 34 after forming the selective opening resist pattern 24 may be smaller than a dimension of the original periodic contact hole pattern 14.

Further, the final dimension of the actually opened contact hole pattern 34 is affected by types of the selective opening pattern, e.g., a single hole, a twin hole, or the like. Furthermore, it is also affected by a dimension of the selective opening pattern irrespective of the types of the selective opening patterns. That is, when the selective opening resist pattern 24 becomes smaller, the final dimension of the contact hole pattern 34 becomes small disadvantageously.

BRIEF SUMMARY OF THE INVENTION

According to one aspect of the present invention, there is provided a manufacturing method of a semiconductor device, comprising: forming a pattern composed of photosensitive resin film, forming a pattern including: forming periodically arranged first contact hole patterns composed of a first photosensitive resin film on a processing film formed above a semiconductor substrate; and forming a selective opening pattern composed of a second photosensitive resin film including a plurality of types of opening patterns on the first photosensitive resin film, whereby forming second contact hole patterns at positions of the plurality of first contact hole patterns selected by the selective opening pattern, wherein forming the first contact hole patterns includes forming the first contact hole patterns having dimensions corrected with respect to each of the plurality of types of opening patterns in such a manner that dimensions of the plurality of second contact hole patterns become equal to each other.

According to another aspect of the present invention, there is provided a manufacturing method of a semiconductor device, comprising: forming a pattern composed of photosensitive resin film, forming a pattern including: forming periodically arranged first contact hole patterns composed of a first photosensitive resin film on a processing film formed above a semiconductor substrate; and forming a selective opening pattern composed of a second photosensitive resin film including a plurality of types of opening patterns on the first photosensitive resin film, whereby forming second contact hole patterns at positions of the plurality of first contact hole patterns selected by the selective opening pattern, wherein forming the selective opening pattern includes correcting a total effective light dose applied to the second photosensitive resin film so as to become equal among the plurality of types of the opening patterns, and wherein the plurality of second contact hole patterns have the same dimension irrespective of the plurality of types of the opening patterns.

According to another aspect of the present invention, there is provided a reticle correcting method of forming a pattern, comprising: using a first reticle including a contact hole reticle pattern to form a plurality of periodically arranged first contact hole patterns composed of a first photosensitive resin film on a processing film formed above a semiconductor substrate; and using a second reticle including a selective opening reticle pattern to selectively form a selective opening pattern composed of a second photosensitive resin film formed on the first photosensitive resin film and including a plurality of types of opening patterns so as to form a plurality of second contact hole patterns at positions corresponding to the plurality of first contact hole patterns selected by the selective opening patterns, wherein the contact hole reticle pattern or the selective opening reticle pattern is corrected with respect to each of the plurality of types of the selective opening patterns in such a manner that the plurality of second contact hole patterns are formed to have the same dimension.

According to another aspect of the present invention, there is provided a reticle pattern data correcting method comprising: creating a test opening reticle having a plurality of types of opening reticle patterns that changes a light intensity of each of opening patterns on a photosensitive resin film and used to form the opening patterns to the photosensitive resin film; forming periodically arranged first contact hole patterns composed of a first photosensitive resin film on a processing film formed above a semiconductor substrate; forming a selective opening pattern composed of a second photosensitive resin film formed on the first photosensitive resin film by forming a plurality of types of opening patterns with different light intensities on the second photosensitive resin film with respect to each of the plurality of types of the opening reticle patterns using the test opening reticle, whereby forming a plurality of second contact hole patterns having different dimensions at positions corresponding to the plurality of the first contact hole patterns selected by the selective opening pattern; measuring dimensions of the formed second contact hole patterns; determining a second contact hole pattern with a dimension equal to a designed contact hole dimension with respect to each of the plurality of types of the opening patterns; determining an opening reticle pattern corresponding to the determined second contact hole pattern with respect to each of the plurality of types of opening patterns; and correcting opening reticle pattern data based on the determined opening reticle patterns.

BRIEF DESCRIPTION OF SEVERAL VIEWS OF THE DRAWING

FIGS. 4A to 4D are views for explaining formation of a single hole pattern according to a first embodiment of the present invention;

FIGS. 5A to 5D are views for explaining formation of contact hole patterns in a wide area opening region according to the first embodiment;

FIG. 12 is a view showing a relationship between a selective opening pattern dimension and a light intensity of the selective opening pattern at a position corresponding to an edge of a contact hole pattern to be formed for explaining the second embodiment;

FIG. 13 is a view showing a light intensity distribution corrected with respect to the second embodiment;

FIGS. 15A to 15C are views showing light intensity distributions of opening patterns for explaining a third embodiment according to the present invention;

FIGS. 17A to 17F are views for explaining a fourth embodiment according to the present invention.

DETAILED DESCRIPTION OF THE INVENTION

Figure 1A:
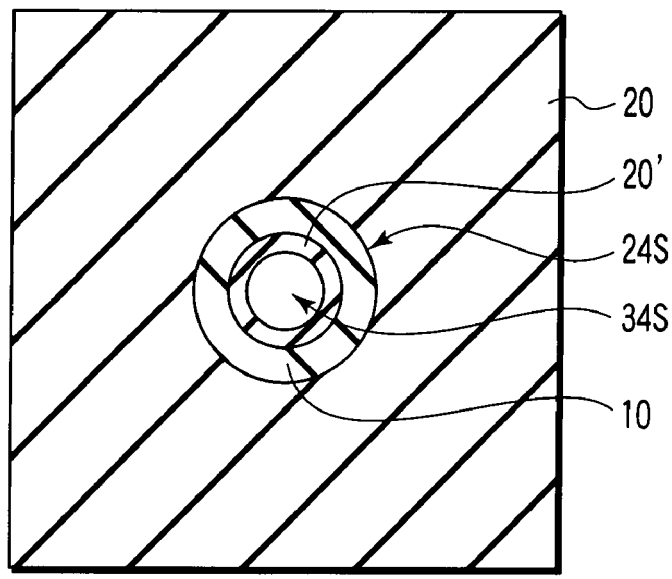
FIGS. 1A and 1B are views for explaining a phenomena to form each contact hole having a desired arrangement by using two resist film layers.

The present invention provides a manufacturing method of a semiconductor device including a pattern forming method of forming randomly arranged fine patterns having substantially equal dimensions irrespective of an arrangement of the fine patterns to be formed, and also provides a reticle correcting method and a reticle pattern data correcting method.

In more detail, the present invention provides a manufacturing method of a semiconductor device including a pattern forming method of forming fine patterns, e.g., contact hole patterns, having substantially equal dimensions irrespective of an arrangement of the fine patterns by correcting, e.g., correcting a reticle pattern, when the randomly arranged fine patterns are formed using two layers of photosensitive resin films (which will be referred to as a resist film, hereinafter), and also provide a reticle correcting method and a reticle pattern data correcting method.

The two layers of the resist film are composed of a first resist film in a lower layer, in which a periodic pattern, e.g., a lattice-point-like arrayed contact hole pattern having contact holes arranged on lattice points, is formed, and an second resist film in an upper layer on the first resist film, in which selective opening patterns, e.g., a single hole, a twin hole, and a wide area opening region pattern, are formed.

In this specification, as examples of a correcting method, a description will be given on (1) a method of correcting a dimension of a lattice-point-like arrayed contact hole pattern composed of the first resist film in advance, (2) a method of correcting a dimension of a selective opening reticle pattern on a selective opening reticle that is used to form a selective opening resist pattern made up of the second resist film, (3) a method of correcting an effective light dose applied to a second photosensitive resin during the exposure for the selective opening pattern by using an auxiliary opening reticle, and (4) a method of correcting a transmittance of the selective opening reticle pattern formed on the selective opening reticle. However, the present invention is not limited to these methods.

The embodiments of the present invention will be described with reference to the accompanying drawings. Throughout the drawings, corresponding portions are denoted by corresponding reference numerals. Each of the following embodiments is illustrated as one example, and therefore the present invention can be variously modified and implemented without departing from the spirits of the present invention.

First Embodiment

A first embodiment of the present invention provides a manufacturing method of a semiconductor device including a resist pattern forming method to form contact hole patterns that have substantially equal dimension even though they are randomly arranged by correcting in advance a dimension of a periodic pattern, e.g., a lattice-point-like arrayed contact hole pattern, composed of a first resist film with respect to each type of corresponding selective opening patterns that is formed later, and also provides a reticle correcting method and a reticle pattern data correcting method.

In a resist pattern forming method according to this embodiment, a dimension of a lattice-point-like arrayed contact hole pattern composed of the first resist film is corrected in advance with respect to each type of the selective opening patterns, e.g., a single hole, a twin hole, a quad hole, or a wide area opening region, composed of a second resist film to be formed on the first resist film. As a result, it can provide the manufacturing method of the semiconductor device including the resist pattern forming method of enabling formation of randomly arranged contact hole patterns that have substantially equal dimensions irrespective of the types of the selective opening patterns composed of the second resist film, and also provide the reticle correcting method and the reticle pattern data correcting method.

FIGS. 2A to 2H show examples of selective opening reticle patterns 22x (various reticle patterns are comprehensively represented as 22x) formed on a second reticle 21 that is used to form each selective opening resist pattern 24X (various resist patterns are comprehensively represented as 24X) of the second resist film 20, and resist patterns provided above a semiconductor substrate 1, e.g., a silicon wafer. FIGS. 2A to 2D are views showing examples of the selective opening reticle patterns 22x, and FIGS. 2E to 2H are views showing a relationship between each selective opening resist pattern 24X composed of the second resist film 20 and each corresponding contact hole pattern 34X (various patterns are comprehensively represented as 34X) opened at positions of the lattice-point-like arrayed contact hole patterns composed of the first resist film 10. As shown in the drawings, the second reticle 21, i.e., a selective opening reticle, includes various types of selective opening reticle patterns 22x, e.g., a single-hole opening reticle pattern 22s in which one contact hole pattern 34 alone is to be opened, a twin-hole opening reticle pattern 22t in which two adjacent contact hole patterns 34 are to be opened, a quad-hole opening reticle pattern 22q in which four adjacent contact hole patterns 34 are to be opened, and a wide area opening region reticle pattern 22w in which contact hole patterns 34W in a wide region are to be opened. The second reticle 21 is used to form various selective opening resist patterns 24S, 24T, and 24Q each composed of the second resist film 20, and a region 24W completely opening the second resist film 20 in a wide region with respect to corresponding selective opening reticle pattern types 22x. It is to be noted that the wide area opening region 24W is denoted by reference character 24W on an outside line of FIG. 2H for the convenience's sake, but the second resist film 20 is actually opened in a wider region than the illustrated region.

It is desirable for final dimensions of the contact hole patterns 34 opened after formation of the selective opening resist patterns 24 to be fixed irrespective of the selective opening resist pattern types 24X. In reality, however, when a dimension of the lattice-point-like arrayed contact hole pattern 14 is reduced, dimensions of the final contact hole patterns 34X vary depending on the types of the selective opening resist patterns 24X.

For example, a description will be given as to a case where the contact hole pattern 14 that is composed of the first resist film 10 and has a pitch of 180 nm and a dimension of 90 nm was first formed and then the selective opening resist pattern 24X composed of the second resist film 20 is formed. Using the selective opening reticle pattern 22w of the wide area opening region, a dimension of the final contact hole pattern 34W is 85 nm. On the other hand, using the single-hole selective opening reticle pattern 22s, a dimension of the final contact hole pattern 34S is 75 nm, and hence this pattern is formed to be 10 nm smaller than the former pattern. Here, a dimension of the single-hole opening reticle pattern 22s is set to 180 nm×180 nm on a wafer that is the same as a pitch of the lattice-point-like arrayed contact hole pattern 14. It is to be noted that, in this specification, a reticle pattern dimension is converted into a value on a resist film (or a wafer) to be exposed, and represented by the converted value for better understanding. Assuming that a reduction ratio of an exposure tool, e.g., a scanner, is 1/4, the selective opening pattern dimension of 180 nm×180 nm on the wafer corresponds to an actual opening reticle pattern dimension of 720 nm×720 nm on the reticle.

The dimension of the final contact hole pattern 34S in the single-hole portion is smaller than the dimension of the final contact hole pattern 34W in the wide area opening region, because a light intensity of an optical image (selective opening pattern) 24X formed on the second resist film 20 is drastically reduced when the dimension of the selective opening reticle pattern 22x is decreased. (It is to be noted that an intensity of light applied to a wafer (resist film) is simply referred to as a "light intensity", and an intensity of light applied to the reticle is referred to as an "exposure intensity").

Figure 3A:
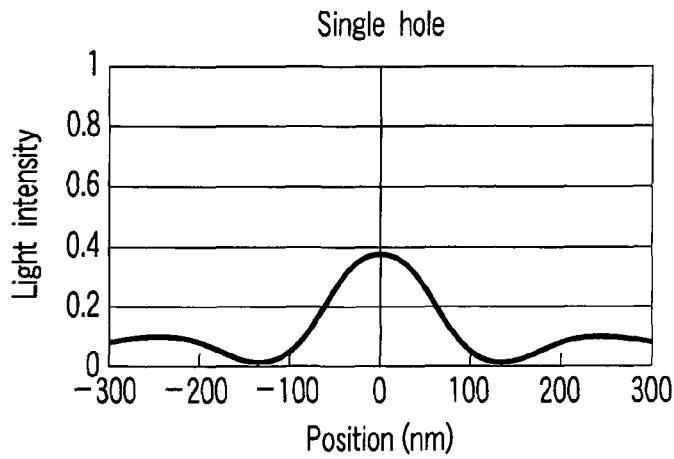
FIGS. 3A to 3C are views showing examples of light intensity distributions based on the selective opening pattern types used in the present invention.
Figure 3B:
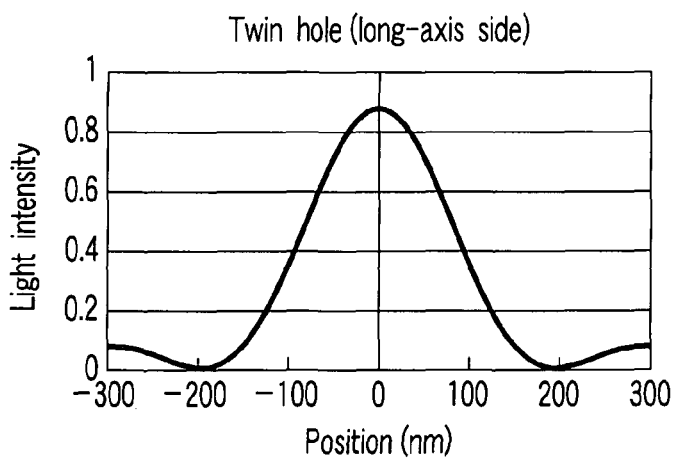
Figure 3C:
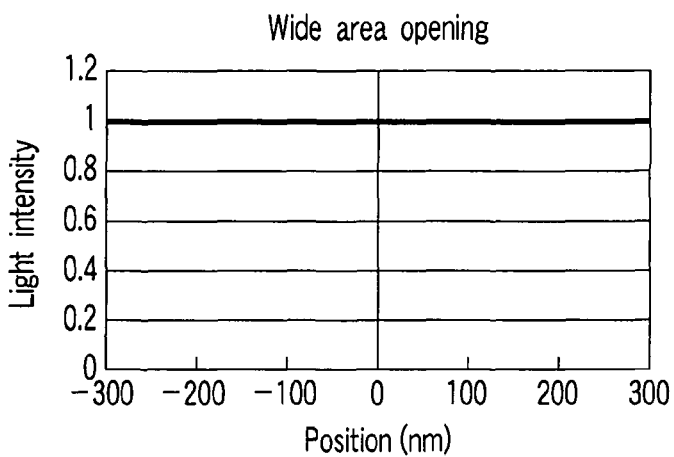

FIGS. 3A to 3C show examples of light intensity distributions. FIGS. 3A to 3C show light intensity distributions obtained on a wafer when a pitch of the lattice-point-like arrayed contact hole pattern 14 is 150 nm and the various selective opening reticle patterns 22x formed on the second reticle 21 are used for exposure. An illumination conditions of the scanner are NA=0.7 and σ=0.3 in regular illumination. FIG. 3A shows a light intensity distribution of the single-hole opening resist pattern 24S of 150 nm×150 nm, FIG. 3B shows a light intensity distribution of a long-axis side of the twin-hole opening resist pattern 27T of 150 nm×300 nm, and FIG. 3C shows a light intensity distribution of the wide area opening region 24W. In the single-hole selective opening resist pattern 24S, it can be understood that the light intensity applied to the second resist film is drastically reduced as compared with the other examples. Assuming that the light intensity in the example of the wide area opening region 24W is 1, the light intensity at the center of the single-hole selective opening resist pattern 24S is reduced to 0.38, and the same of the twin-hole selective opening resist pattern 24T is likewise decreased to 0.88. Further, the light intensity is further reduced at a position corresponding to an edge of the lattice-point-like arrayed contact hole pattern 14 to be opened (i.e., ±37.5 nm and ±112.5 nm from the center in each case) where the light intensity becomes the weakest within the contact hole(s), and the light intensity thereof becomes 0.30 and 0.26, respectively.

If the light intensity of the selective opening resist pattern 24 is weakened, then a dose of light applied to the second resist film 20 is reduced. As a result, a dissolution rate is lowered at the time of development of the second resist film 20, and a thickness of a second resist film 20' (see FIG. 1B) remaining on a side surface of the underlying lattice-point-like arrayed contact hole pattern 14 becomes thicker. As a result, a final dimension of the contact hole pattern 34 becomes small.

Thus, in the first embodiment, as shown in FIGS. 4A to 4D and 5A to 5D, a dimension of the lattice-point-like arrayed contact hole pattern 14 composed of the first resist film 10 is corrected in advance with respect to the type of the selective opening resist pattern 24X of the second resist film 20 being formed on the first resist film 10. As a result, a variation in the dimension of the final contact hole patterns 34X that is dependent on the types of the selective opening resist patterns 24X can be corrected.

FIGS. 4A to 4D show an example where the single-hole contact hole pattern 34S is formed, and FIGS. 5A to 5D show an example where the contact hole pattern 34W of the wide area opening region is formed. FIGS. 4A and 5A show each lattice-point-like arrayed contact hole reticle pattern 12x of a first reticle 11, and FIGS. 4B and 5B show each lattice-point-like arrayed contact hole pattern 14X composed of the first resist film 10 on the wafer. FIGS. 4C and 5C show each selective opening reticle pattern 22x of the second reticle 21, and FIGS. 4D and 5D show each selective opening resist pattern 24X composed of the second resist film 20 and each final contact hole pattern 34X.

In this embodiment, a specific lattice-point-like arrayed contact hole pattern 14S of the first resist film 10, which corresponds to a part where a contact hole pattern 34S is to be formed using the single-hole selective opening resist pattern 24S, is formed larger than other lattice-point-like arrayed contact hole patterns 14, in advance. A correcting method of the lattice-point-like arrayed contact hole pattern 14S will now be explained specifically.

As described above, when the contact hole pattern 14 that is composed of the first resist film 10 and has a dimension of 90 nm is first formed according to a designed value, and then, the selective opening resist pattern 24X is formed. The final contact hole pattern 34S of 75 nm is formed by using the single hole selective opening resist pattern 24S and the final contact hole pattern 34W of 85 nm is formed by using the wide area opening region 24W, actually. That is, the final contact hole patterns 34S and 34W are 15 nm and 5 nm smaller than the designed contact hole dimension 90 nm, respectively.

Thus, considering the dimension changes, the lattice-point-like arrayed contact hole pattern 14S having a dimension of (90+15)=105 nm is formed in a region where the single-hole contact hole pattern 34S is to be formed, and the lattice-point-like arrayed contact hole pattern 14W having a dimension of (90+5)=95 nm is formed in a region where the contact hole pattern 34W is to be formed in the wide area opening region. In order to realize the correction, dimensions of the lattice-point-like arrayed contact hole reticle pattern 12x, e.g., 12s and 12w, of the first reticle 11 is corrected and formed to be 15 nm and 5 nm larger than the designed dimension on the wafer with respect to the types of the selective opening resist patterns 24X, respectively.

When the lattice-point-like arrayed contact hole reticle pattern 12s or 12w having the dimension corrected in advance is used, the final contact hole pattern 34X having the dimension substantially equal to a designed dimension irrespective of the selective opening resist pattern type 24X can be formed.

In FIG. 4A, when the single-hole selective opening pattern is used, the dimension of one specific lattice-point-like arrayed contact hole reticle pattern 12s alone in the region where an opening is to be formed is corrected. However, all of the dimension of the lattice-point-like arrayed contact hole patterns 12 including both patterns to be opened and not to be opened can be corrected into the same dimension as the lattice-point-like arrayed contact hole reticle pattern 12s.

In the description above, the example where the selective opening resist pattern 24 has both the regions of the single hole 24S and the wide area opening 24W is explained. However, even if the region of the twin hole 24T and regions of other types of selective opening resist patterns 24X are simultaneously present, the lattice-point-like arrayed contact hole reticle pattern 12x of the first reticle 11 can be corrected by the same technique can be used.

As explained above, the dimension of the lattice-point-like arrayed contact hole pattern 14X arranged on lattice points composed of the first resist film 10 is corrected in advance with respect to the types of the selective opening resist patterns 24X to be composed of the second resist film 20. As a result, the contact hole patterns 34X having substantially the same dimensions irrespective of the selective opening resist pattern type 24X can be formed at any desired positions of the lattice points.

Figure 6:
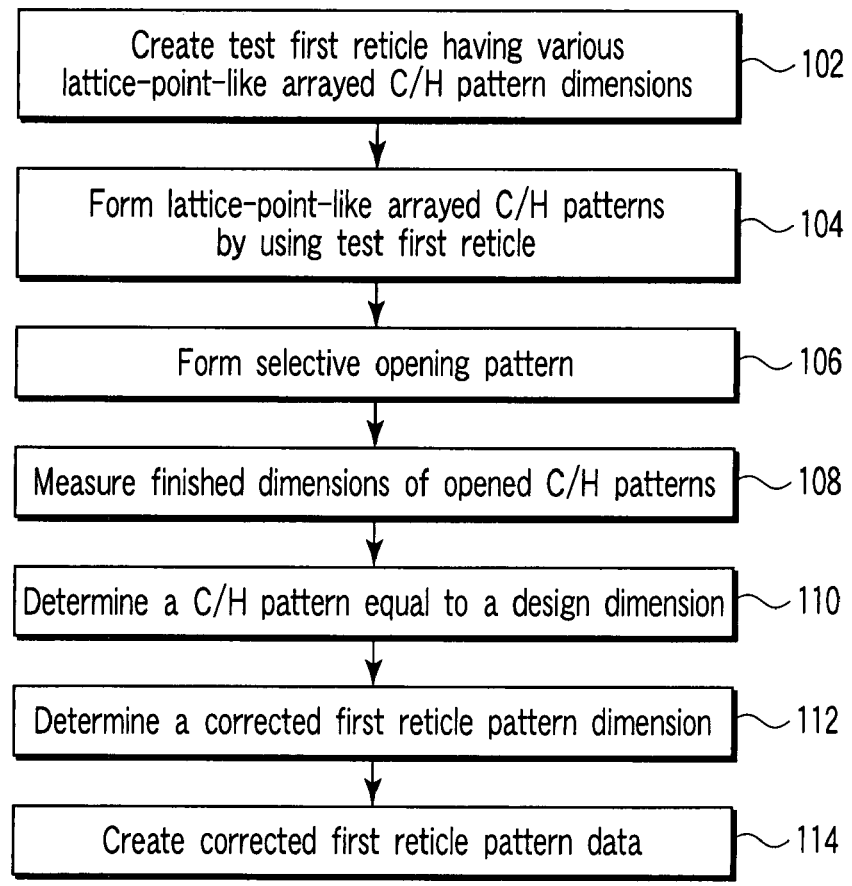
FIG. 6 is a process flowchart for explaining an example of a correcting method according to the first embodiment.

According to this embodiment, in order to form the corrected contact hole pattern 34X, reticle pattern data to create the first reticle 11 used to form the lattice-point-like arrayed contact hole pattern 14X needs to be generated. FIG. 6 is an example of a process flowchart for explaining a method of creating reticle pattern data. A method of creating reticle pattern data according to this embodiment will now be explained with reference to FIG. 6.

In step 102, a test first reticle 11 in which dimensions of lattice-point-like arrayed contact hole reticle patterns 12xi are changed to Mx1, Mx2, ..., and Mxn with respect to each selective opening pattern 22x is created. Each lattice-point-like arrayed contact hole reticle pattern 12xi corresponds to a part where the contact hole (C/H) patterns 34xi are to be opened by using corresponding selective opening patterns 22X. In the example shown in FIGS. 4A to 4D, the dimension of the lattice-point-like arrayed contact hole reticle pattern 12 corresponding to a part that is not actually opened should be in the range where it is guaranteed that the lattice-like arrayed contact hole patterns 14 composed of the first resist film 10 can be formed. However, if the lattice-point-like arrayed contact hole reticle patterns 12x corresponding to a given selective opening resist pattern type 24X, e.g., the single hole 24S, are allowed to have the same dimension in the entire region, then all patterns 12 and 12s in the region can have the same dimension. In any case, the dimension of the lattice-point-like arrayed contact hole pattern 12x corresponding to a part that is not opened should be the dimension to be used after correcting the dimension of the contact hole to be opened.

In step 104, the test first reticle 11 having the various pattern dimensions is used to form lattice-point-like arrayed contact hole patterns 14Xi with various dimensions in the first resist film 10. Dimensions of the lattice-point-like arrayed contact hole patterns 14Xi are RX1, RX2, ..., RXn corresponding to the dimensions of the lattice-point-like arrayed contact hole reticle patterns 12xi of the first reticle 11 Mx1, Mx2, ..., Mxn.

Then, in step 106, the each of various selective opening resist pattern types 24X composed of the second resist film 20, e.g., the single hole 24S, the twin hole 24T, the wide area opening region 24W, and others is formed on the first resist film 10 having the lattice-point-like arrayed contact hole patterns 14Xi formed to have various dimensions. The final dimension of each contact hole pattern 34X varies after forming the selective opening resist pattern 24X. This variation in dimension is caused due to overlaying the resist films. The dimension is dependent on the types of the selective opening resist patterns 24X, and this variation needs to be corrected with respect to each selective opening resist pattern type 24X.

In step 108, with respect to each dimension Mxi of the first lattice-point-like arrayed contact hole reticle pattern 12x, a final dimension HXi of the contact hole pattern 34X opened by each type of selective opening resist pattern 24X is measured. That is, the final dimension of the contact hole pattern 34S with respect to the single-hole selective opening resist pattern 24S is HS1, HS2, . . . , or HSn, the final dimension with respect to the twin hole 24T is HT1, HT2, . . . , or HTn, and the final dimension with respect to the wide area opening region 24W is HW1, HW2, . . . , or HWn. Just after formation of the lattice-point-like arrayed contact hole pattern composed of the first resist film 10, the dimension of each contact hole pattern is RX1, RX2, . . . , or RXn. However, the dimension of each contact hole pattern changes to HX1, HX2, . . . or HXn after forming the selective opening resist pattern 24X composed of the second resist film 20 on the first resist film 10.

Then, in step 110, a contact hole pattern with the final dimension HXi which is equal to a designed contact hole dimension Hd is determined with respect to each selective opening resist pattern type 24X. That is, x, y, . . . , or z that achieves HSx=HTy= . . . =HWz=Hd is determined. For example, the final dimension of the contact hole pattern HXi after forming the selective opening resist pattern 24X is plotted against the dimension MXi of the lattice-point-like arrayed contact hole reticle pattern 12x with respect to each selective opening resist pattern type 24X. Then, a final contact hole pattern dimension HXj that becomes equal to Hd is obtained.

When, x, y, . . . , or z is determined, a reticle pattern dimension Msx, Mty, . . . , or Mwz of the first reticle 11 corresponding to x, y, . . . , or z is determined (step 112). This Mxi becomes a corrected lattice-point-like arrayed contact hole reticle pattern dimension that should be formed on the first reticle 11. Corrected reticle pattern data is created from this corrected pattern dimension Mxi (step 114).

As explained above, it is to be noted in creating reticle pattern data that a variation in dimension is caused by overlaying the resist films but the variation needs to be corrected with respect to each selective opening pattern type since it depends on each selective opening pattern type. Correction in the case of the single second resist pattern is disclosed in Jpn. Pat. Appln. KOKAI Publication No. 2005-275386.

As explained above, according to the embodiment, it can be provided a manufacturing method of a semiconductor device including a pattern forming method of forming randomly arranged fine contact hole patterns with substantially equal dimensions irrespective of, e.g., an arrangement of the contact hole patterns to be formed or selective opening pattern types, and also a reticle correcting method and a reticle pattern data correcting method.

Modification of First Embodiment

In the first embodiment, the method of forming a lattice-point-like arrayed contact hole pattern by using one reticle has been explained. In this modification, a method of forming a lattice-point-like arrayed contact hole pattern by using two upper and lower reticles of the line-and-space patterns that are perpendicular to each other in horizontal and vertical directions will be described. In this case, a part where the upper and lower spaces overlap will be a lattice-point-like arrayed contact hole pattern.

When the two upper and lower layers of the line-and-space patterns that are perpendicular to each other are used, a finer contact hole can be formed as compared with an example where one reticle is used to form a lattice-point-like arrayed contact hole pattern like in the first embodiment. Therefore, if a fine selective opening pattern is used, especially the single hole pattern, then a difference in dimension of the contact hole between the single hole region and the wide area opening region becomes larger. Therefore, correction of the variation in dimension of the contact hole becomes more important.

Figure 7A:
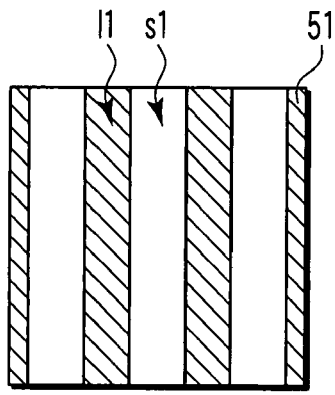
FIGS. 7A to 7C are views for explaining an example of a reticle pattern used in a modification of the first embodiment.
Figure 7B:
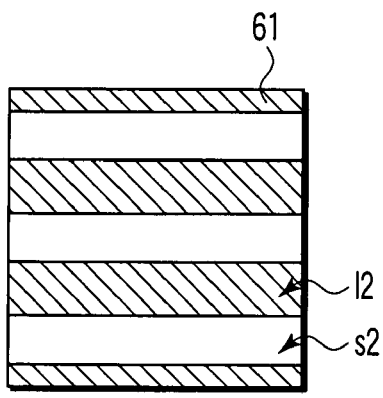
Figure 7C:
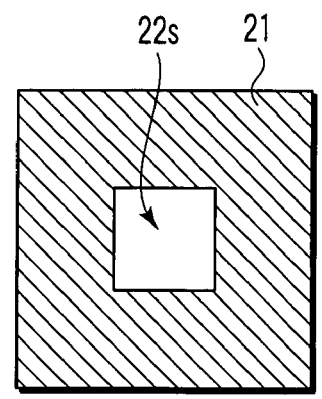

As shown in FIGS. 7A to 7C, this modification uses three reticles, i.e., a first reticle 51 having a line-and-space pattern l1, s1 to form a line-and-space pattern L1, S1 composed of a lower resist film 50, depicted in FIG. 7A, a second reticle 61 having a line-and-space pattern l2, s2 to form another line-and-space pattern L2, S2 composed of an upper resist film 60, depicted in FIG. 7B, and a selective opening reticle 21 having a selective opening reticle pattern 22 to form a selective opening pattern 24 composed of the third resist film 70 as shown in FIG. 7C.

An example of the resist pattern forming method according to this modification will now be explained with reference to FIGS. 8A to 8E and 9A to 9F.

Figure 1B:
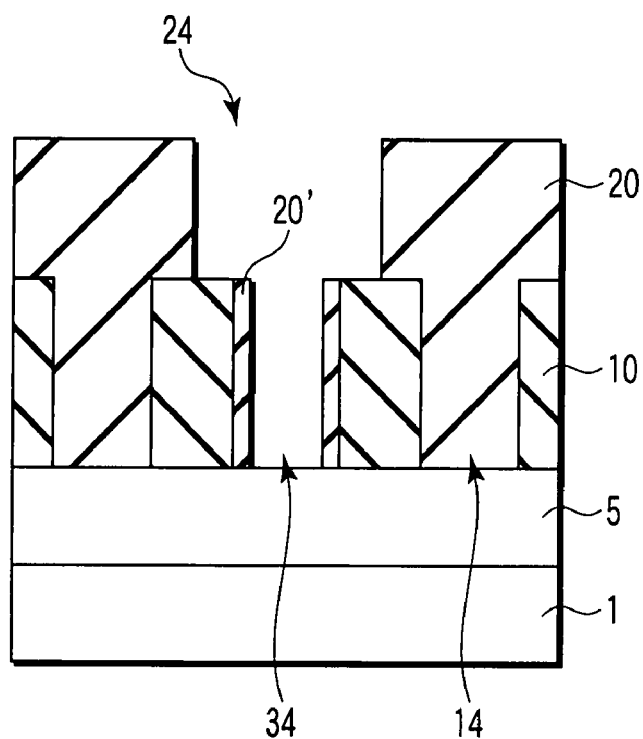
Figure 2A:
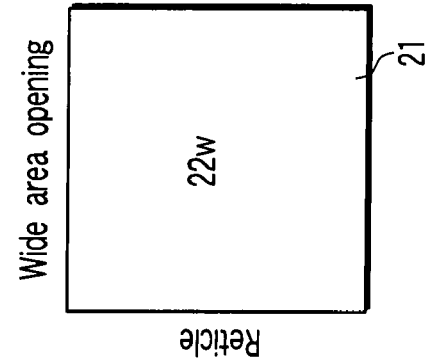
FIGS. 2A to 2H are views for explaining examples of selective opening pattern types used in the present invention.
Figure 2B:
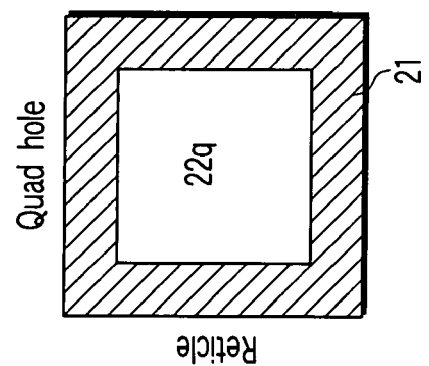
Figure 2C:
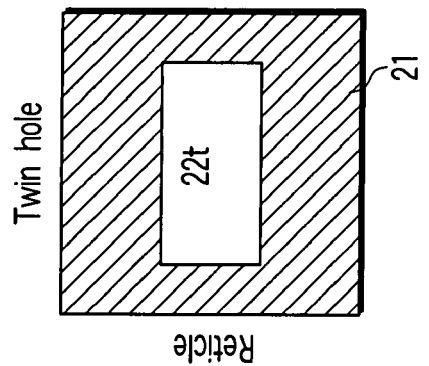
Figure 2D:
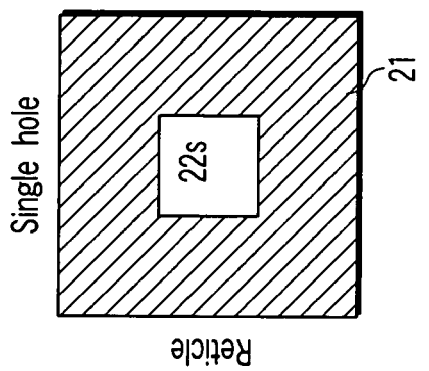
Figure 2E:
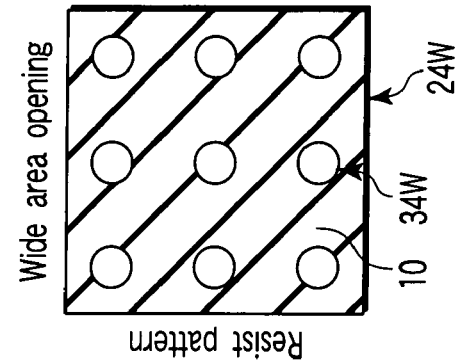
Figure 2F:
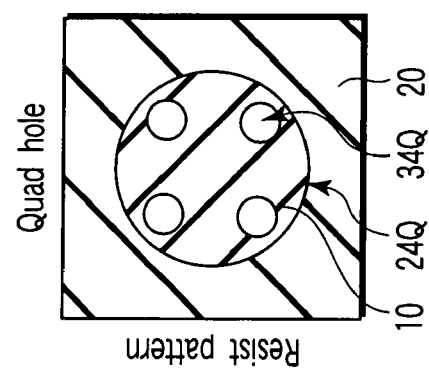
Figure 2G:
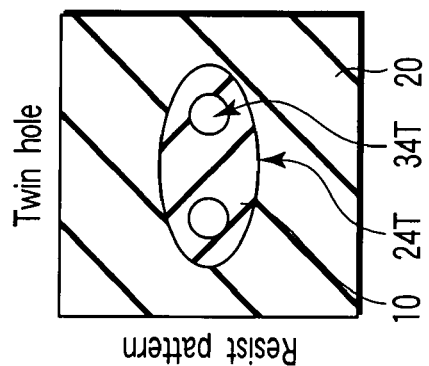
Figure 2H:
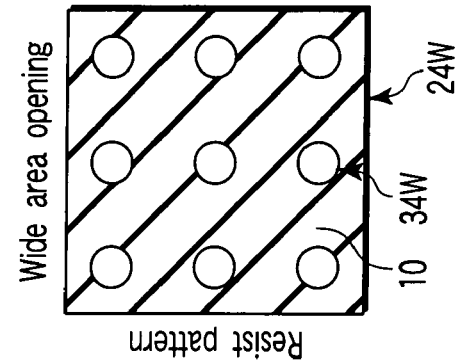
Figure 8A:
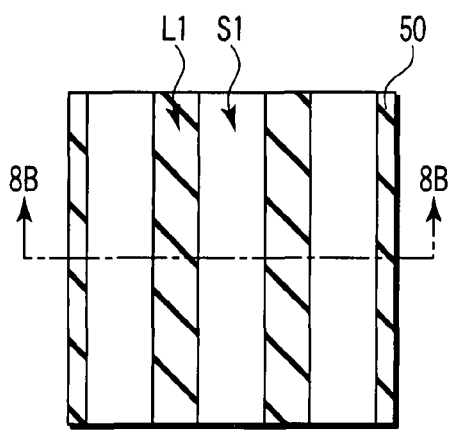
FIGS. 8A to 8E are views for explaining an example of a manufacturing process of the modification of the first embodiment.
Figure 8B:
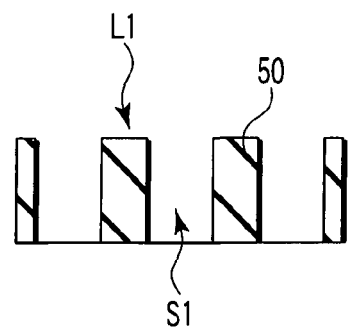

As shown in FIGS. 8A and 8B, the first reticle 51 is used to form, e.g., the lower line-and-space pattern L1, S1 in the first resist film 50 running in a vertical direction. FIG. 8A is a plan view of the lower line-and-space pattern L1, S1, and FIG. 8B is a cross-sectional view of the first resist film 50 taken along a cutting-plane line 8B-8B depicted in FIG. 8A. The lower line-and-space pattern is formed with a space width S1 wider than a line width L1. It is to be noted that the cross-sectional view of FIG. 8B shows a cross-sectional structure of the resist film alone of interested, and a substrate 1 and a processing film 5 depicted in FIG. 1 are omitted. This is also applied to the drawings following FIG. 8B for explaining the cross-sectional structure.

Figure 8C:
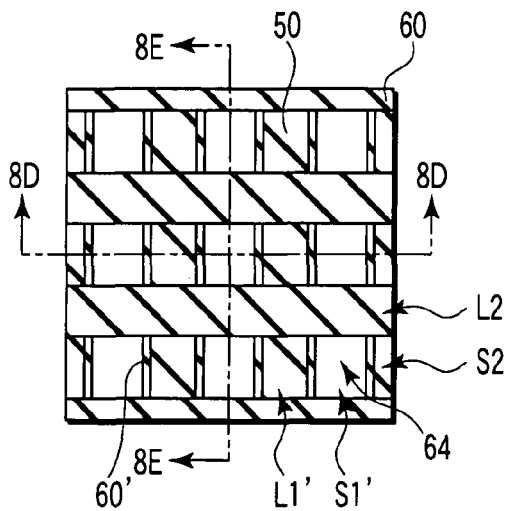
Figure 8D:
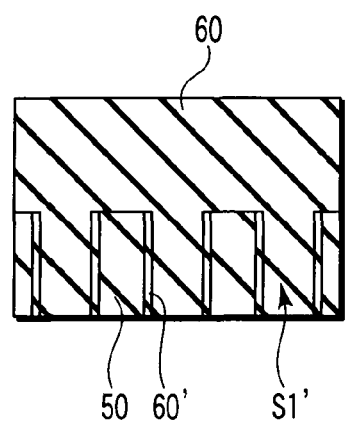
Figure 8E:
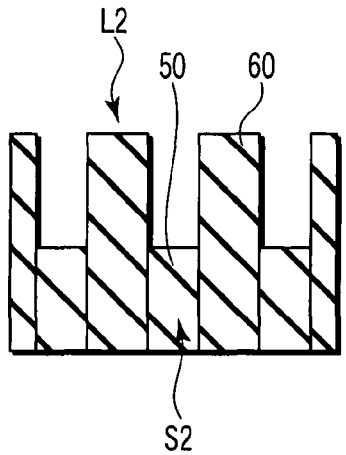

Then, the second resist film 60 is formed on the first resist film 50 formed the lower line-and-space pattern L1, S1 thereto. As shown in FIGS. 8C, 8D, and 8E, the second reticle 61 is used to form the upper line-and-space pattern L2, S2 composed of the second resist film 60. The upper line-and-space pattern L2, S2 is perpendicular to the lower line-and-space pattern L1, S1, for example, extending in a horizontal direction. FIG. 8C is a plan view showing a state after forming the upper line-and-space pattern L2, S2, FIG. 8D is a cross-sectional view of the resist films 50 and 60 taken along a cutting-plane line 8D-8D depicted in FIG. 8C, and FIG. 8E is a cross-sectional view of the resist films 50 and 60 taken along a cutting-plane line 8E-8E depicted in FIG. 8C. A lattice-point-like arrayed contact hole pattern 64 is formed at an intersection of spaces S1 and S2 of the upper and lower line-and-space patterns. However, as shown in FIGS. 8C and 8D, when forming the upper line-and-space pattern, a part of a second resist film 60' remains in the space S1 of the lower pattern although it is a small amount, thereby narrowing the space (S1'). Considering this change in dimension, in the upper line-and-space pattern L2, S2, the space width S2 is reduced which is narrower than the space width S1 of the lower pattern in order to form a square lattice-point-like arrayed contact hole pattern 64.

Figure 9A:
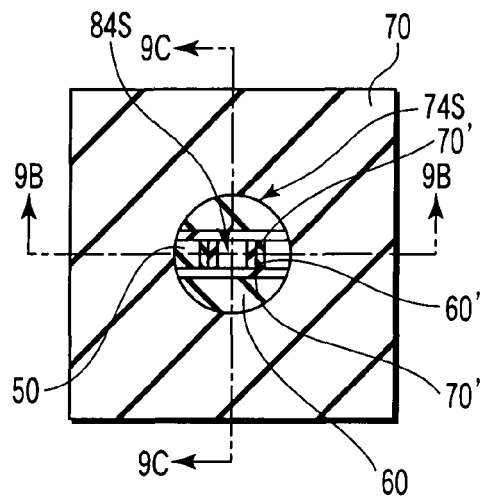
FIGS. 9A to 9F are views for explaining the example of the manufacturing process of the modification of the first embodiment.
Figure 9B:
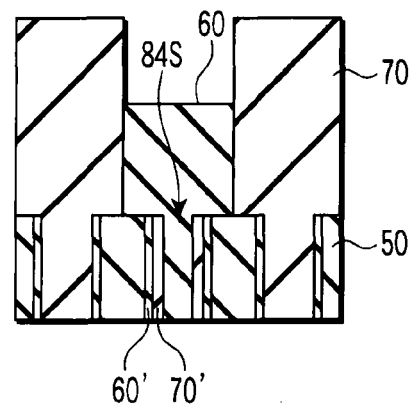
Figure 9C:
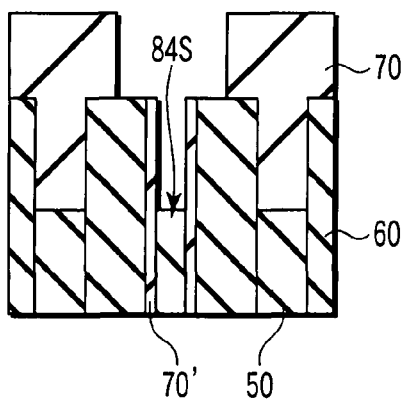
Figure 9D:
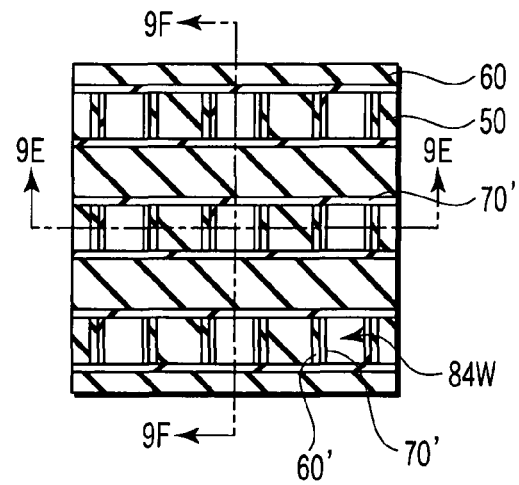
Figure 9E:
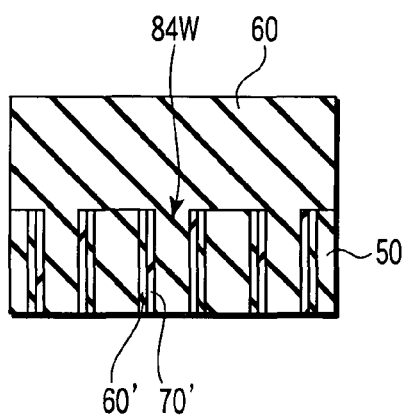
Figure 9F:
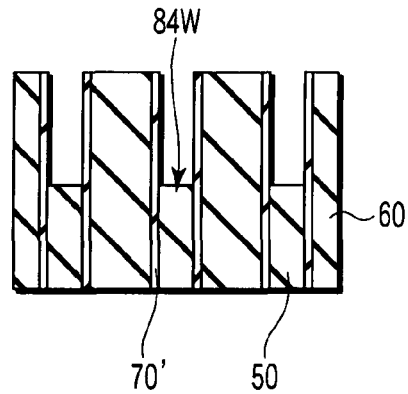

Then, as shown in FIGS. 9A to 9F, a selective opening resist pattern 74 composed of a third resist film 70 is formed by using the third reticle 21. FIG. 9A is a plan view showing an example where a single-hole selective opening resist pattern 74S is formed, FIG. 9B is a cross-sectional view of the resist films 50, 60, and 70 taken along a cutting-plane line 9B-9B depicted in FIG. 9A, and FIG. 9C is a cross-sectional view of the resist films 50, 60, and 70 taken along a cutting-plane line 9C-9C depicted in FIG. 9A. FIG. 9D is a plan view in the case of a wide area opening region 74W, FIG. 9E is a cross-sectional view of the resist films 50, 60, and 70 taken along a cutting-plane line 9E-9E depicted in FIG. 9D, and FIG. 9F is a cross-sectional view of the resist films 50, 60, and 70 taken along a cutting-plane line 9F-9F depicted in FIG. 9D.

After forming the selective opening resist pattern 74X, a thickness of a third resist film 70' remaining on an inner wall of the underlying lattice-point-like arrayed contact hole pattern 64 in the single-hole selective opening resist pattern 74S region is thicker than that in the wide area opening region 74W. Therefore, in the case of the wide area opening region 74W, a change in dimension of the contact hole pattern 84W before and after formation of the selective opening resist pattern 74 is not large. However, in the case of the single-hole selective opening resist pattern 74S, like the first embodiment, a change in dimension of the contact hole pattern 84S before and after formation of the selective opening resist pattern 74 is large, and thus a final dimension of the contact hole pattern 84S is smaller than that of the contact hole pattern 84W in the wide area opening region.

Furthermore, in this modification, the contact hole pattern 84 having a finer dimension than that in the first embodiment can be formed. In such a case, therefore, a change in dimension of the contact hole pattern 84S unearthed by the finer single hole becomes larger than that in the first embodiment.

In this modification, a resist pattern forming method and reticle pattern data creating method that enable a variation in dimension to be corrected to form the contact hole patterns 84X having substantially equal dimensions irrespective of a selective opening pattern type are the same as those in the first embodiment. Therefore, a detailed explanation will be omitted. A difference lies in that a test reticle with various pattern dimensions is used with respect to each of the first reticle 51 and the second reticle 61. As a result, a correction amount for each of the first and the second reticles can be determined. Based on the determined correction amounts, the first and the second reticle pattern dimensions that enable formation of the contact hole patterns 84X having substantially equal dimensions irrespective of a selective opening pattern type can be respectively determined.

In correction of a pattern dimension, a space width in the entire space can be corrected, such as, the increase of the space width. Alternatively, the space width can be partially corrected at and near an intersection of the space portions of the upper and lower line-and-space patterns.

In this manner, this modification can likewise provide a manufacturing method of a semiconductor device including a pattern forming method of forming randomly arranged fine contact hole patterns having substantially equal dimensions irrespective of an arrangement of the contact hole patterns to be formed or a selective opening pattern types, and also provide a reticle correcting method and a reticle pattern correcting method.

Second Embodiment

In a second embodiment according to the present invention, a dimension of a selective opening reticle pattern is corrected with respect to a selective opening pattern type. As a result, a total effective light dose applied to a second resist film is no longer dependent on the types of the selective opening patterns. Accordingly, this embodiment provides a manufacturing method of a semiconductor device including a resist pattern forming method of forming randomly arranged contact hole patterns having substantially equal dimensions irrespective of selective opening pattern types, and a reticle correcting method and a reticle pattern data correcting method. In this embodiment, as different from the first embodiment, a dimension of a lattice-point-like arrayed contact hole pattern 14 that is first formed is fixed, and the dimension of the lattice-point-like arrayed contact hole pattern 14 also does not dependent on each selective opening pattern type that is subsequently formed.

In the above-explained example in the first embodiment, comparing the case where the selective opening reticle pattern 22x is, e.g., a single hole 22s with the case where the pattern 22x is a wide area opening region 22w, when selective opening patterns are formed after forming a contact hole pattern 14 having a designed dimension of 90 nm, a final dimension of the contact hole pattern 34S in the single hole region 22s is 10 nm smaller than that 34W in the wide area opening region 22w.

In this embodiment, first, a lattice-point-like arrayed contact hole pattern 14 having a pitch of 180 nm and a final dimension of 90 nm is formed of a first resist film 10 by using, e.g., a quadrupole illumination. A dimension of a single-hole selective opening reticle pattern 22s formed on a selective opening reticle 21 is 180 nm×180 nm on a wafer.

One factor of causing a final dimension of the contact hole pattern 34X to vary depending on a selective opening pattern type 22x is a difference in light intensity distribution on the wafer that is dependent on the selective opening pattern type 22x as explained above (as shown in, e.g., FIGS. 3A to 3C). There are several methods of correcting a dimension of the selective opening reticle pattern 22x in this embodiment. For example, there are a method of utilizing a light intensity distribution on a wafer to determine a correction amount, a method of actually producing a pattern and determining a correction amount based on a result of pattern production, and others.

The method of utilizing a light intensity distribution to determine a correction amount will be explained first.

Figure 10A:
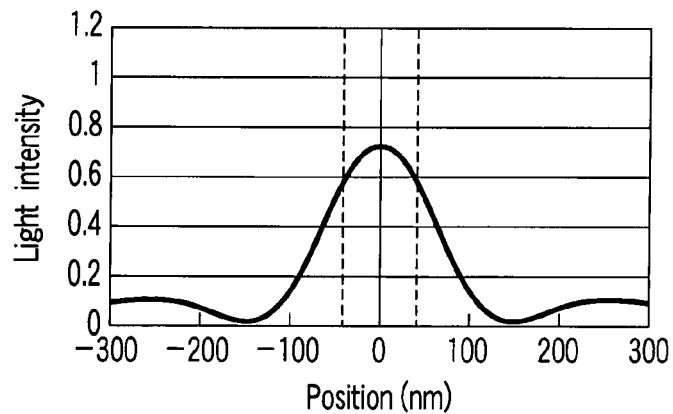
FIGS. 10A and 10B are views showing light intensity distributions on a wafer based on selective opening reticle pattern types for explaining a second embodiment according to the present invention.
Figure 10B:
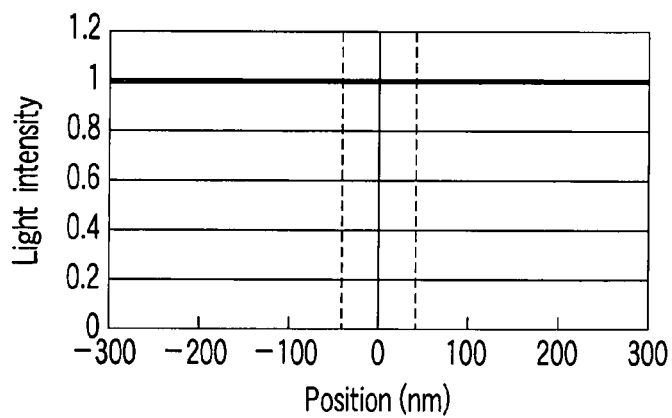

FIGS. 10A and 10B are views showing an example of a light intensity distribution on a wafer in a selective opening reticle pattern 22x. FIG. 10A shows a light intensity distribution in the case of a single-hole selective opening reticle pattern 22s, of which each side is 180 nm, and FIG. 10B shows a light intensity distribution in the case of a wide area opening region 22w. A final dimension of a contact hole pattern 34X to be opened is 90 nm, and a position corresponding to an edge of the contact hole pattern 34X, i.e., each position that is ±45 nm from the center, is indicated by a vertical broken line in the drawing. FIGS. 10A and 10B show results of obtaining a light intensity distribution based on simulation, but an actual light intensity distribution can be measured by using an optical power meter for a small region, e.g., AIMS_fab193 manufactured by Carl Zeiss.

Figure 11:
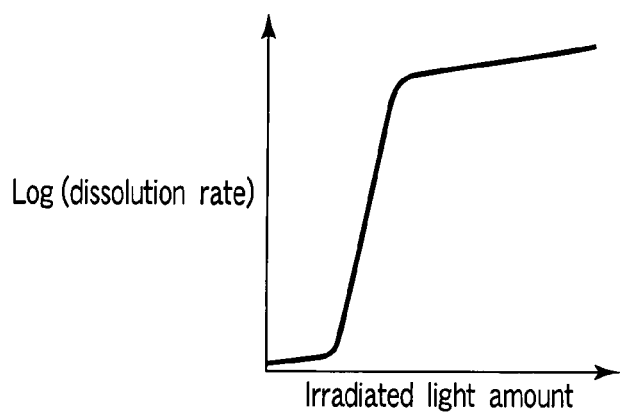
FIG. 11 is a view showing a relationship between an irradiation light dose on a resist film and a dissolution rate of the resist film at the time of development.

As can be understood from FIGS. 10A and 10B, assuming that a light intensity distribution in the case of the wide area opening region 22w is 1, a light intensity at a pattern edge portion of the contact hole pattern 34S to be formed is reduced to 0.55 in the case of the single-hole selective opening reticle pattern 22s having a dimension of 180 nm. As shown in FIG. 11, a dissolution rate of a resist film at the time of development has an S-shaped rate distribution with respect to a dose of light applied to the resist film. That is, when a dose of irradiation light is small or large, a change in dissolution rate of the resist film is small even if the dose of irradiation light varies. However, in the case of an intermediate dose of irradiation light, when the dose of irradiation light varies, the dissolution rate of the resist film also changes extremely. Therefore, in this reason, when forming the contact hole pattern 34S by using the single-hole selective opening reticle pattern 22s, a dose of irradiation light is reduced, and a dissolution rate of a second resist film is lowered. As a result, the second resist film on an inner wall of an underlying lattice-point-like arrayed contact hole pattern 14 is not sufficiently removed and remains, thus a final dimension is reduced. Therefore, when the light intensity is corrected in such a manner that a light intensity at an edge of the single-hole contact hole pattern 34S becomes 1, a final dimension of the contact hole pattern 34S formed with the single-hole opening pattern can be substantially equal to that of the contact hole pattern 34W in the wide area opening region.

The light intensity distribution on the wafer also varies depending on a dimension of the selective opening reticle pattern 22x even if the selective opening pattern type remains the same. FIG. 12 is a view showing an example of a light intensity of an optical image on a wafer at a position that is ±45 nm from the center corresponding to an edge of the contact hole pattern 34S to be formed as a function of a dimension of one side of the single-hole selective opening reticle pattern 22s. The light intensity becomes strong as the dimension of one side of the selective opening reticle pattern 22s increases, and the light intensity becomes 1 when the dimension of the side becomes approximately 220 nm. When the dimension further increases, the light intensity becomes stronger. The light intensity becomes maximum in the vicinity of a side dimension of 340 nm, and then it becomes weaker. This tendency is caused by effects of light diffraction and interference. Therefore, if a dimension of one side of the single-hole selective opening reticle pattern 22s is set to 220 nm, the light intensity becomes 1 at the edge of the contact hole pattern 34S, i.e., a position that is 45 nm from the center.

FIG. 13 shows an example of a light intensity when the thus corrected single-hole selective opening reticle pattern 22s is used to perform exposure. As apparent from the drawing, the light intensity is 1 or above at a position corresponding to the contact hole pattern 34S to be formed, i.e., in a region that is within ±45 nm from the center, and this example demonstrates that the contact hole pattern 34S having a desired dimension can be formed.

Although correction of a dimension of the single-hole selective opening reticle pattern 22s has been explained here, dimensions of other selective opening reticle pattern types 22x can be corrected in the similar manner. That is, an opening dimension of each selective opening reticle pattern 22x is corrected in such a manner that a light intensity becomes 1 at a position having a minimum light intensity at positions corresponding to edges of the contact hole 34X to be formed by each selective opening reticle pattern 22x.

If the dimension of the selective opening reticle pattern 22x is corrected in this manner, a region where the light intensity exceeds 1 is formed. However, as shown in FIG. 11, if a dose of irradiation light has a fixed value or above, a change in the dissolution rate of the resist film becomes small with respect to a change in the dose of irradiation light. That is, in that region, the fact that the dissolution rate of the second resist film is sufficiently high and does not substantially affect a final dimension of the contact hole is utilized.

In the above-explained example, for each selective opening reticle pattern type 22x, correction is performed in such a manner that the light intensity becomes 1 at a position having the minimum light intensity among positions corresponding to edges of the contact hole pattern 34X to be formed. However, even if the corrected minimum light intensity does not become equal as explained above, the same effect can be obtained by correcting the light intensity that effectively does not affect a final dimension of the contact hole due to the resist dissolving character shown in FIG. 11.

Figure 14:
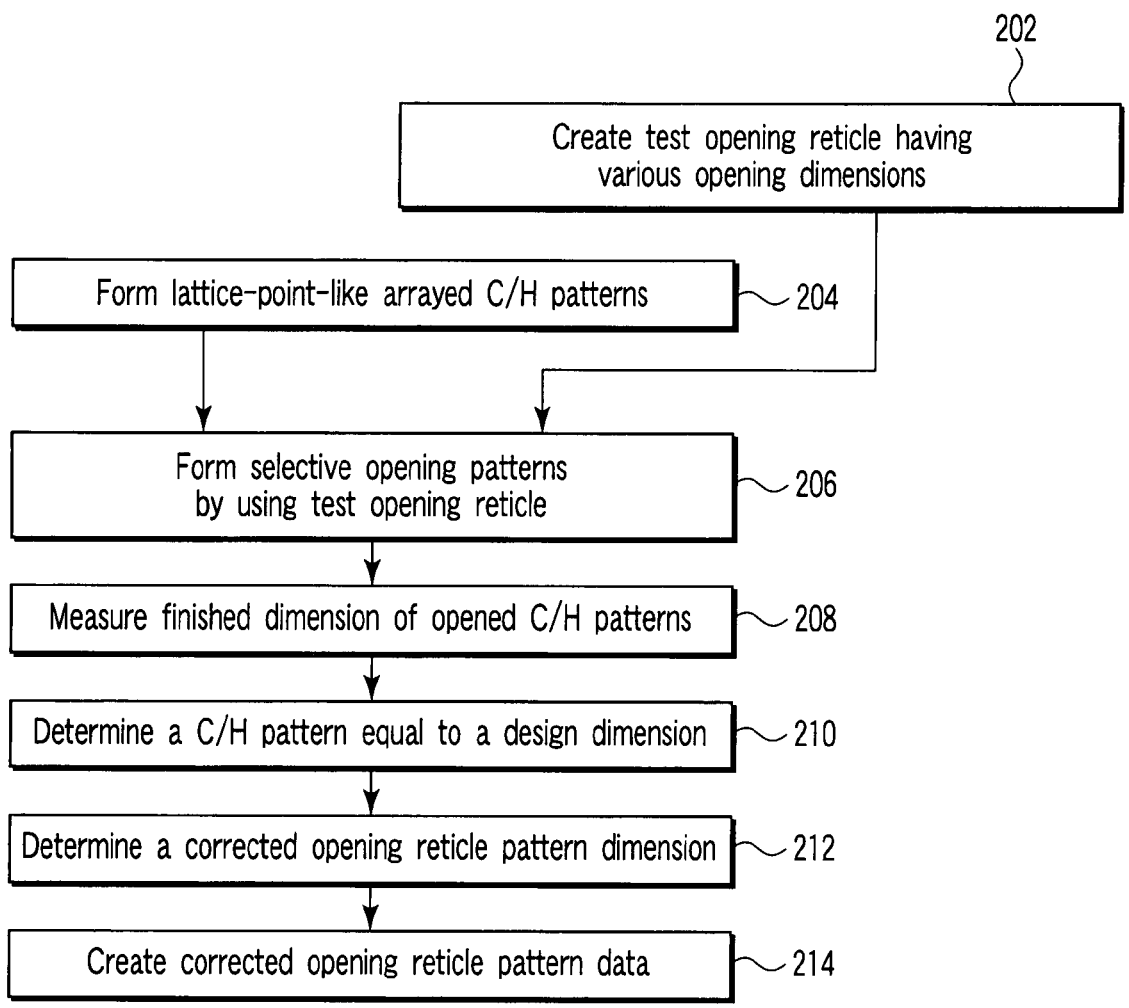
FIG. 14 is a process flowchart for explaining an example of a correcting method according to the second embodiment.

An example of a method of actually producing a test pattern and correcting a dimension of a selective opening reticle pattern 22 based on a result of pattern production will now be explained with reference to a process flowchart depicted in FIG. 14.

First, in step 202, a test selective opening reticle, i.e., a second reticle 21, whose opening dimension is changed with respect to each selective opening reticle pattern type 22x is created in advance. The dimensions of the selective opening reticle pattern 22xi are, e.g., Ms1, Ms2, . . . , and Msn with respect to a single hole, Mt1, Mt2, . . . , and Mtn with respect to a twin hole, Mw in the case of a wide area opening region, and others.

In step 204, a first reticle 11 is used to form a lattice-point-like arrayed contact hole pattern 14 composed of a first resist film 10. A dimension of the lattice-point-like arrayed contact hole pattern 14 is common to all the selective opening reticle pattern types 22x, which is R.

Then, in step 206, a second resist film 20 is formed on the lattice-point-like arrayed contact hole pattern 14 composed of the first resist film 10. The test opening reticle created at the step 202 is used to form each of various selective opening resist patterns 24Xi whose dimensions are changed. For example, in the case of the single hole, dimensions of contact hole patterns 34S that are formed by each opening reticle pattern of dimensions Ms1, Ms2, . . . , and Msn are HS1, HS2, . . . , and HSn, respectively. That is, the final dimension of the lattice-like arrayed contact hole pattern composed of the first resist film is changed from R to HS1, HS2, . . . , or HSn after forming the single-hole opening resist pattern composed of the second resist film. In the case of the wide area opening region Mw, a final dimension of a contact hole pattern 34W is HW. It is to be noted that the final dimension of the contact hole pattern 34X varies depending on each selective opening reticle pattern type 22x. This variation in dimension of the contact hole pattern is caused by overlaying the resist films. The dimension of the contact hole pattern needs to be corrected with respect to each pattern type since it is dependent on each selective opening pattern type.

In step 208, a final dimension HXi of the contact hole pattern 34Xi formed with respect to each selective opening reticle pattern type 22xi is measured. That is, as explained above, the final dimensions HS1, HS2, . . . , and HSn of the contact hole pattern 34Si formed by, e.g., the single-hole selective opening reticle patterns with dimensions of Ms1, Ms2, . . . , and Msn are measured, respectively.

Then, in step 210, a contact hole pattern with the final dimension HXi, which is equal to a designed contact hole dimension Hd is determined with respect to each selective opening reticle pattern type 22x. That is, each of h, j, and so forth that achieves HSh=HTj= . . . =HW=Hd is determined. For example, with respect to each selective opening pattern type, a final dimension HXi of the contact hole pattern is plotted as a function of a dimension of each selective opening reticle pattern 22xi. Then, a dimension HSh, HTj, and so forth of each selective opening reticle pattern that becomes equal to the designed contact hole dimension Hd is obtained.

HW is adjusted to be equal to Hd in advance by adjusting an exposure amount when forming the lattice-point-like arrayed contact hole pattern 14 or correcting a pattern dimension of the first reticle 11 to be used.

When each of h, j, and so forth is determined, each pattern dimension Msh, Mtj, and so forth of the second reticle 21 corresponding to each selective opening pattern type is determined (step 212). The Mxi is a corrected dimension of the selective opening reticle pattern that should be formed on the second reticle 21. Based on the determined selective opening reticle pattern dimension Mxi, corrected opening reticle pattern data is created (step 214).

In either of the correcting method using the light intensity distribution or the correcting method using the actually created test pattern can be adopted, the selective opening pattern dimension to be corrected is determined, and then corrected reticle pattern data required to manufacture the corrected reticle is created.

As explained above, according to the embodiment, it can be provided a manufacturing method of a semiconductor device including a pattern forming method of forming randomly arranged fine contact hole patterns with substantially equal dimensions irrespective of, e.g., an arrangement of the contact hole patterns to be formed or selective opening pattern types, and also a reticle correcting method and a reticle pattern data correcting method.

Third Embodiment

In a third embodiment according to the present invention, a difference in light intensity distribution that is dependent on each selective opening pattern type is corrected by additional exposure using an auxiliary opening reticle in such a manner that total effective light dose irradiated on a second resist film becomes even among opening pattern types. As a result, the total effective dose, i.e., an accumulated light intensity, given to the second resist film is no longer dependent on each selective opening pattern type. Therefore, this embodiment can provide a manufacturing method of a semiconductor device including a resist pattern forming method that enables forming contact hole patterns having substantially equal dimensions irrespective of a type or a dimension of each selective opening pattern even if the contact hole patterns are randomly arranged, and also a reticle correcting method and a reticle pattern data correcting method.

In this embodiment, like the second embodiment, a lattice-point-like arrayed contact hole pattern having a pitch of 180 nm and a dimension of 90 nm is first formed in a first resist film by using, e.g., a quadrupole illumination. Then, each of various selective opening patterns is used to selectively form contact hole pattern(s) at random positions on the lattice points. Although examples where the selective opening pattern is a single hole and a wide area opening region will be explained here, any selective opening pattern can be used.

In the resist film used in the foregoing embodiment, a difference of 10 nm occurs in the final dimension of the contact hole pattern 34X between the case where the selective opening reticle pattern is the single hole 22s and the case where the selective opening reticle pattern is the wide area opening region 22w. In this embodiment, a selective opening reticle 21 having various types of selective opening patterns 22x is used to expose the second resist film 20 at first, and then an auxiliary opening reticle corresponding to each selective opening pattern type is used to correct a difference in irradiation light dose among the selective opening pattern types. In this case, an opening pattern dimension of the auxiliary opening reticle must not be too large in order to avoid unearthing a lattice-point-like arrayed contact hole pattern to be buried adjacent to that to be opened by the selective opening pattern. The opening pattern dimension of the auxiliary opening reticle is preferably a dimension smaller than that of each corresponding selective opening reticle pattern. For example, when a dimension of the square single-hole selective opening reticle is 180 nm of one side, a dimension of a square opening pattern of the auxiliary opening reticle is 150 nm of one side.

FIGS. 15A to 15C show examples of light intensity distribution when square opening reticle patterns are used for exposure. FIG. 15A shows a light intensity distribution when a single-hole selective opening reticle pattern with 180 nm of each side is used, FIG. 15B shows a light intensity distribution when an auxiliary opening reticle pattern with 150 nm of each side is used, and FIG. 15C shows an accumulated light intensity distribution after double exposure using the two reticle patterns depicted in FIGS. 15A and 15B (i.e., a light intensity distribution obtained by combining the light intensity distribution of A with the light intensity distribution of B). Assuming that a light intensity in the case of a wide area opening region 22w is 1, a light intensity at an edge of a contact hole pattern 34S to be formed, i.e., at a position that is ±45 nm from the center, is 0.55 in a single-hole selective opening pattern 22s, and 0.27 in the auxiliary opening reticle pattern. Thus, an accumulated light intensity at an edge of the contact hole pattern 34S after double exposure can be achieved to 1 when an exposure dose of the auxiliary opening reticle pattern is 1.68 times larger than that of the single hole selective opening reticle pattern, as shown in FIG. 15C. In this manner, even in the case of the single hole, the final dimension of the contact hole pattern 34S can be the same final dimension as that of the wide area opening region.

When the selective opening reticle includes various types of the selective opening patterns, such as a single hole and a twin hole, an exposure dose of the auxiliary opening reticle pattern is corrected in such a manner that an accumulated light intensity at a position having a minimum light intensity among positions corresponding to edges of each contact hole pattern 34X becomes 1. In a region where the accumulated light intensity exceeds 1, a dissolution rate of a resist film at the time of development is sufficiently high as explained above, and a difference in light intensity does not substantially affect a final dimension of the contact hole pattern 34X.

In the above-explained embodiment, the accumulated light intensity after double exposure of each selective opening pattern and its corresponding auxiliary opening pattern is set to be equal to a light intensity of the wide area opening region at a position having the minimum light intensity among positions corresponding to edges of the contact hole pattern to be formed. However, even if the light intensity is not completely equal to that of the wide area opening region, the same effect can be obtained when the accumulated light intensity becomes the light intensity that does not substantially affect a final dimension.

In the embodiment above, the double exposure by the selective opening pattern and the auxiliary opening pattern is explained by way of example. It can also be applied multiple exposure by dividing, for example, the exposure of the auxiliary opening pattern into multiple times. In the multiple exposure, the same or different auxiliary opening pattern may be used.

Figure 16:
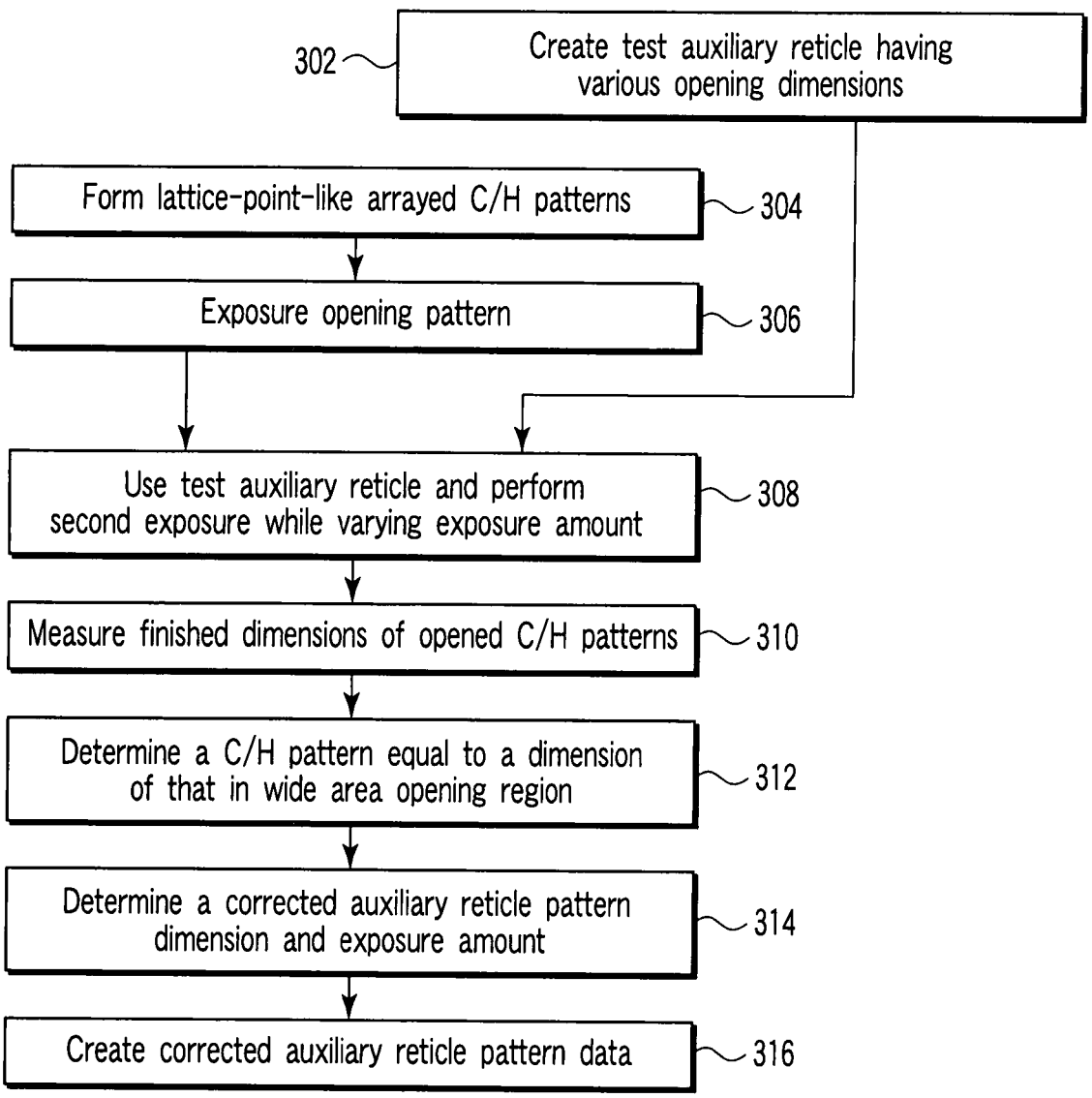
FIG. 16 is a process flowchart for explaining an example of a correcting method according to the third embodiment.

In this embodiment, likewise, the contact hole pattern can be experimentally formed according to an example of a process flowchart shown in FIG. 16, and a dimension of the auxiliary opening reticle pattern and an exposure dose can be determined based on a result thereof.

In step 302, a test auxiliary opening reticle is created in advance. The test auxiliary opening reticle has opening patterns whose dimensions vary depending on each selective opening pattern type, e.g., Ms1, Ms2, . . . , and Msn with respect to the single hole, Mt1, Mt2, . . . , and Mtn with respect to the twin hole, and so forth, and Mw with respect to the wide area opening hole.

In step 304, a first reticle is used to form lattice-point-like arrayed contact hole patterns 14 of a first resist film 10. A dimension of the lattice-point-like arrayed contact hole pattern 14 is common to all selective opening reticle pattern types 22x, which is R.

Then, in step 306, a second resist film 20 is formed on lattice-point-like arrayed contact hole patterns 14 composed of the first resist film 10. First, the second resist film 20 is exposed with the second reticle having each of various selective opening retile patterns 22x.

Then, in step 308, the test auxiliary opening reticle created at the step 302 is used to expose the second resist film 20 while varying exposure dose d, thereby forming each selective opening resist pattern 24Xi-dm.

In step 310, with respect to each selective opening reticle pattern type 22x, a final dimension HXi-dm of the contact hole pattern 34Xi is measured with respect to each test auxiliary opening reticle dimension 22xi by each exposure dose dm. That is, the final dimension HXi-dm of the contact hole pattern that has been changed from the initial dimension R of the lattice-point-like arrayed contact hole pattern 14 due to formation of the selective opening pattern 22X is measured. For example, in the case of the test auxiliary opening reticle pattern dimension Ms1 with respect to the single-hole selective opening reticle pattern 22s, a final dimension HS1-d1, HS1-d2, . . . , or HS1-dm of the contact hole pattern 34S is measured with respect to each exposure dose dm. In regard to the test auxiliary opening reticle pattern dimension Ms2, . . . , and Msn for each of other single holes, the final contact hole pattern dimension HSi-dm is likewise measured.

Furthermore, in terms of the other types of selective opening reticle patterns 22x except for the single hole, a final dimension HXi-dm of the contact hole pattern after forming the selective opening resist pattern 22X is likewise measured.

In step 312, the measured contact hole pattern dimension HXi-dm, which is equal to a contact hole pattern dimension HW of the wide area opening region, e.g., in the case of the single hole, each of HS1-dh, HS2-dj, . . . is obtained.

Moreover, in step 314, a plurality of combinations of the auxiliary opening reticle pattern dimension and the exposure dose corresponding to the contact hole pattern dimension HXi-dm obtained at the step 312 are acquired. In the combinations, there is a relation that as the auxiliary opening reticle dimension increases, the exposure dose reduces. However, the auxiliary opening reticle pattern dimension has a limit to avoid digging out of an adjacent contact hole to be buried in the first resist film. On the other hand, there is a problem that a throughput is decreased when the auxiliary opening reticle pattern dimension is reduced and the exposure dose is increased. Accordingly, a preferred combination of the auxiliary opening reticle pattern dimension and the exposure dose is determined from the plurality of obtained combinations thereof.

Based on the thus determined preferable combination of the auxiliary opening reticle pattern dimension and the exposure dose, corrected auxiliary opening reticle pattern data required to manufacture a corrected auxiliary opening reticle pattern is created (step 316).

Although an accumulated light intensity is adjusted based on an exposure dose of the auxiliary opening reticle pattern in this example, an auxiliary opening reticle in which transmittance of each type of the pattern is adjusted according to each of a necessary exposure dose in place of changing the exposure dose may be created. In this case, a difference in light intensity depending on opening reticle pattern types can be corrected by a single exposure using one auxiliary opening reticle. As a method of adjusting a transmittance of the auxiliary opening reticle, there is, e.g., a method to adjust transmittance by adding a translucent film and changing a film thickness thereof with respect to each selective opening pattern type to effect adjustment, a method to adjust transmittance by changing an irradiation dose of ions applied to an opening pattern portion, or a method of forming a fine pattern on a reticle that is smaller than a resolution limit of the exposure tool, e.g., a fine line-and-space pattern to adjust transmittance by changing a ratio of a line width and a space width of the pattern.

As explained above, according to the embodiment, it can be provided a manufacturing method of a semiconductor device including a pattern forming method of forming randomly arranged fine contact hole patterns with substantially equal dimensions irrespective of, e.g., an arrangement of the contact hole patterns to be formed or selective opening pattern types, and also a reticle correcting method and a reticle pattern data correcting method.

Fourth Embodiment

According to a fourth embodiment of the present invention, a transmittance of a selective opening reticle pattern is corrected to adjust differences in light intensities that are dependent on various selective opening pattern types. As a result, an effective light dose given to a second resist film is no longer dependent on each selective opening pattern type. It can be provided a manufacturing method of a semiconductor device including a resist pattern forming method that enables forming contact hole patterns having substantially equal dimensions irrespective of each selective opening pattern type even though the contact hole patterns are randomly arranged, and also provide a reticle correcting method and a reticle pattern data correcting method.

In this embodiment, a minimum light intensity, at a position corresponding to edges of contact hole pattern(s) to be formed in a selective opening pattern is compared with those among various selective opening reticle pattern types 22x. Based on a result of this comparison, final contact hole patterns 34X having substantially equal dimensions irrespective of each selective opening reticle pattern type 22x are formed by reducing respective transmittances of selective opening reticle patterns except for the pattern with the minimum light intensity among pattern types.

This embodiment will now be specifically explained in detail hereinafter.

First, like the modification of the first embodiment explained in conjunction with FIGS. 8A to 8E and 9A to 9F, an example where two line-and-space patterns perpendicular to each other are used to form each lattice-point-like arrayed contact hole pattern 64 will be described. As explained in conjunction with the modification, a common space portion of the two line-and-space patterns that are perpendicular to each other becomes the lattice-point-like arrayed contact hole pattern 64. Here, each of the line-and-space patterns perpendicular to each other is formed with a pitch of, e.g., 150 nm by exposure using a dipole illumination in such a manner that a dimension of the common space is 85 nm in both a vertical and a horizontal directions after formation of a line-and-space pattern of an upper resist film.

A selective opening reticle 21 is used to form a selective opening resist pattern 74 on the upper line-and-space resist film. In this embodiment, an example where the selective opening reticle patterns 22x include a single-hole pattern 22s, a twin-hole pattern 22t, a quad-hole pattern 22q, and a wide area opening region 22w will be explained. A pattern dimension of the selective opening reticle 21 is multiple of the pitch of the line-and-space patterns. That is, an opening dimension of the single-hole selective opening reticle pattern 22s is 150 nm×150 nm, the same of the twin hole 22t is 150 nm×300 nm, and the same of the quad hole 22q is 300 nm×300 nm. Furthermore, exposure conditions are adjusted in such a manner that a dimension of a final contact hole pattern 84X becomes 75 nm.

FIGS. 17A to 17F are views showing examples of a light intensity distribution on a wafer that are dependent on the opening pattern types 22x.

The single-hole selective opening reticle pattern 22s will be first explained. In the case of the single hole, exposure with the selective opening reticle is carried out in such a manner that the center of the selective opening resist pattern 74S composed of a third resist film 70 corresponds with the center of the lower lattice-point-like arrayed contact hole pattern to be opened. FIG. 17A is a view showing a light intensity distribution on the wafer based on the single-hole selective opening reticle pattern 22s, and FIG. 17B is a view showing a positional relationship between the selective opening reticle pattern 22s and a contact hole pattern 84S to be formed. A position corresponding to the edge of the contact hole pattern 84S is ±37.5 nm from the center in the x- and y-directions. This position is indicated by a vertical broken line in FIG. 17A. Assuming that a light intensity in the case of the wide area opening region is 1, a light intensity at that position of ±37.5 nm is 0.30.

Likewise, FIGS. 17C and 17D, and 17E and 17F show light intensity distributions and positional relationships of contact hole patterns in the twin-hole reticle pattern 22t and the quad-hole reticle pattern 22q.

In the case of the twin-hole reticle pattern 22t, the position, where the light intensity becomes minimum among positions corresponding to the edge of the contact hole pattern 84T is ±112.5 nm from the center on the x-axis. This position is indicated by a vertical broken line in FIG. 17C. A light intensity at that position is 0.26.

In the case of the quad-hole reticle pattern 22q, a position where the light intensity becomes minimum among positions corresponding to the contact hole pattern 84Q is ±143.6 nm from the center in a diagonal direction of the selective opening reticle pattern 22q. This position is also indicated by a vertical broken line in FIG. 17E. A light intensity at that position is 0.30.

A minimum light intensity on the contact hole pattern 84X to be formed is obtained with respect to each of the selective opening reticle pattern types 22x in this manner. These minimum light intensities are compared with each other among the selective opening pattern types. With respect to the selective opening pattern type having the minimum light intensity, i.e., the light intensity of the twin hole in this example, transmittances of the other reticle patterns 22x are corrected to be the same light intensity. In this embodiment, each transmittance of the reticle pattern is 87% in the single hole, 100% in the twin hole, 87% in the quad hole, and 26% in the wide area opening region.

When the transmittance is corrected with respect to each selective opening reticle pattern type 22x in this manner, it can be obtained the randomly arranged contact hole patterns 84X having substantially equal dimensions irrespective of each selective opening reticle pattern type 22x.

In the foregoing embodiment, the minimum light intensity at the position corresponding to the edges of the contact hole pattern to be opened in a selective opening pattern is compared among various selective opening pattern types, and the transmittances of the opening patterns except the pattern having the minimum light intensity are reduced such that their light intensities on the resist film are equal to that of the pattern having the minimum light intensity. However, even if the light intensities are not exactly equal to each other, the same effect can be obtained when a difference in the light intensity does not substantially affect final dimensions of the contact holes as explained in the second embodiment with reference to FIG. 11.

A method of adjusting the transmittance of the reticle will now be explained. As a method of adjusting the transmittance of the reticle, there is, e.g., a method to adjust transmittance by adding a translucent film and changing a film thickness thereof with respect to each selective opening pattern type to effect adjustment, a method to adjust transmittance by an irradiation dose of ions applied to an opening pattern portion, or a method of forming a fine pattern on a reticle that is smaller than a resolution limit of an exposure tool used, e.g., a fine line-and-space pattern to adjust transmittance by changing a ratio of a line width and a space width of the pattern.

The method of forming the fine line-and-space pattern on a reticle that is smaller than a resolution limit will be explained here. When a conventional illumination is used for exposure, assuming that an exposure wavelength is λ and a lens numerical aperture of an exposure tool is NA, a line-and-space pattern whose period is smaller than λ/NA is not resolved. While, assuming that a line width is L and a space width is S, a transmittance is represented as S/(L+S). Therefore, the transmittance can be adjusted by changing a ratio of the line width and the space width of the line-and-space pattern.

Figure 18:
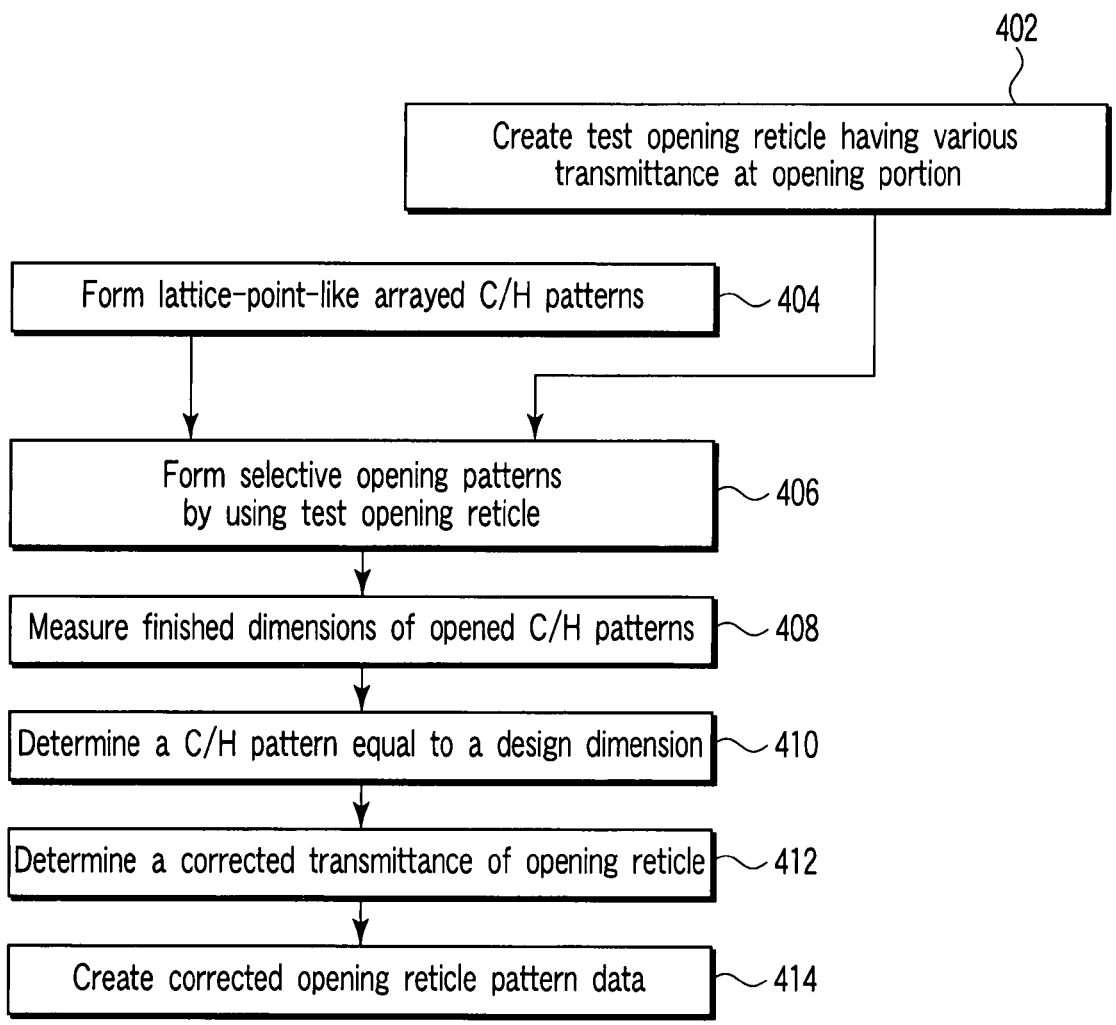
FIG. 18 is a process flowchart for explaining an example of a correcting method according to the fourth embodiment.

In the above example, the method to correct the transmittance-based on the aerial image intensity has been explained. In this embodiment, like the first to the third embodiments, the transmittance can be experimentally determined with respect to each selective opening reticle pattern type 22x. An example of the procedure will now be explained with reference to a process flowchart depicted in FIG. 18.

In step 402, a test selective opening reticle whose transmittance is changed with respect to each selective opening reticle pattern type 22x is created in advance. A transmittance in each selective opening reticle pattern type 22x is represented as Txi. Here, x denotes a selective opening pattern type, i.e., a single hole s, a twin hole t, . . . , or a wide area opening region w, and i designates a transmittance, for example, 1 represents 10%; 2, 20%; . . . ; and 10, 100%.

In step 404, lattice-point-like arrayed contact hole patterns 64 are composed of a first and second lower resist films 50 and 60 are formed. The lattice-point-like arrayed contact hole pattern 64 can be formed by using two line-and-space pattern reticles that are perpendicular to each other, but it can be also formed by using a single first reticle like the first embodiment. A dimension of the lattice-point-like arrayed contact hole pattern 64 is common to all selective opening reticle patterns 22, which is R.

Then, in step 406, a third resist film 70 is formed on the lattice-point-like arrayed contact hole pattern 64 composed of the lower resist films 50 and 60. Each selective opening resist pattern 74Xi is formed by exposing the third resist film 70 by using the test selective opening reticle created at the step 402. As a result, a dimension HXi of the final contact hole pattern 84Xi varies from common R according to a transmittance Txi of a corresponding selective opening reticle pattern.

In step 408, the dimension HXi of each final contact hole pattern 84Xi is measured. For example, in the case of the single hole, the dimension HS1, . . . , or HS10 of the final contact hole pattern 84Xi is measured with respect to the transmittance Ts1, . . . , or Ts10 of the selective opening reticle pattern 22si.

Then, in step 410, the final contact hole pattern, whose dimension HXj is equal to the designed value, is determined with respect to each of the selective opening pattern types 22x. For example, in regard to all the selective opening pattern types 22x, the final dimension HXi of each contact hole pattern 84Xi vs the transmittance Tsi is plotted, thereby determining the final contact hole pattern whose dimensions is equal to the designed value. Then the corresponding transmittance Txj is determined. In this manner, the corrected transmittance Txj is determined with respect to each selective opening reticle pattern type 22x (step 412).

Based on the determined transmittance Txj for each selective opening pattern type, selective opening reticle pattern data to produce the reticle pattern with the corrected transmittance is created in step 414.

As explained above, according to the embodiment, it can be provided a manufacturing method of a semiconductor device including a pattern forming method of forming randomly arranged fine contact hole patterns with substantially equal dimensions irrespective of, e.g., an arrangement of the contact hole patterns to be formed or selective opening pattern types, and also a reticle correcting method and a reticle pattern data correcting method.

The present invention can be modified and carried out in many ways without being restricted to the foregoing embodiments.

For example, in the embodiments described above, in order to form final contact hole patterns having substantially equal dimensions irrespective of each selective opening pattern type, the method of correcting the dimension of the lower lattice-point-like arrayed contact hole pattern, the method of correcting the dimension of each selective opening pattern, the method of using the auxiliary opening reticle, and the method of correcting the transmittance of the selective opening reticle have been separately explained. However, two or more of these methods can be combined to be carried out.

In the foregoing embodiments, the light intensity of each selective opening pattern is represented with, e.g., the wide area opening region being determined as a reference, i.e., 1. However, depending on a design of a semiconductor device, such a region may not be present. In such a case, taking account of the light intensity distribution of each selective opening pattern, a minimum light intensity at a position corresponding to edges of each contact hole to be formed in a selective opening pattern can be compared among various selective opening patterns. Then, the light intensities at those positions are corrected to be effectively the same among that of the respective selective opening patterns.

In the foregoing embodiments, the description has been given as to the example where a converted dimension of the reticle opening pattern on the wafer is equal to a dimension of the resist opening pattern on the wafer. However, for example, the dimension of the resist pattern formed on the wafer may vary by changing exposure conditions. Further, a larger margin may be obtained by increasing the dimension of the reticle opening pattern depending on a type of the opening pattern, a pattern dimension, illumination conditions, materials to be used, and others. Alternatively, reducing the dimension of the reticle opening pattern may be desirable in some cases. Even in a case where a dimension of the final resist pattern on the wafer is changed from a converted dimension of the reticle opening pattern on the wafer, the correcting method of forming the resist pattern, the correcting method of the reticle, and optimization of these methods can be carried out like the foregoing embodiments.

In the embodiments explained above, the single-hole selective opening reticle pattern has a square shape. However, forming the single-hole selective opening resist pattern is the same as forming an isolated contact hole pattern. Therefore, in place of using the square opening pattern, various methods proposed to form an isolated contact pattern, e.g., a method of using a selective opening pattern having an assist features constituted of a phase shifter or the like added thereto, can be utilized. In that case, the correcting method of forming the resist pattern, the correcting method of the reticle, and optimization of these methods can be carried out by the same technique.

Although the example where a scanner is used as the exposure tool has been explained in the foregoing embodiments, the present invention can be applied to an example of forming a fine pattern by using other exposure tools, e.g., an optical exposure tool other than a scanner or an exposure tool using an X ray or SOR light as a light source.

As explained above, according to the embodiments of the present invention, it can be provided a manufacturing method of a semiconductor device including a pattern forming method of forming randomly arranged fine contact hole patterns with substantially equal dimensions irrespective of, e.g., an arrangement of the contact hole patterns to be formed or selective opening pattern types, and also a reticle correcting method and a reticle pattern data correcting method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor device, comprising:
    forming a pattern composed of photosensitive resin film, forming a pattern including:
    forming periodically arranged first contact hole patterns composed of a first photosensitive resin film on a processing film formed above a semiconductor substrate; and
    forming a selective opening pattern composed of a second photosensitive resin film including a plurality of types of opening patterns on the first photosensitive resin film, whereby forming second contact hole patterns at positions of the plurality of first contact hole patterns selected by the selective opening pattern,
    wherein forming the first contact hole patterns includes forming the first contact hole patterns having dimensions corrected with respect to each of the plurality of types of opening patterns in such a manner that dimensions of the plurality of second contact hole patterns become equal to each other.

2. The manufacturing method of a semiconductor device according to claim 1,
    wherein the first contact hole pattern is constituted of two line-and-space patterns perpendicular to each other.

3. A manufacturing method of a semiconductor device, comprising:
    forming a pattern composed of photosensitive resin film, forming a pattern including:
    forming periodically arranged first contact hole patterns composed of a first photosensitive resin film on a processing film formed above a semiconductor substrate; and
    forming a selective opening pattern composed of a second photosensitive resin film including a plurality of types of opening patterns on the first photosensitive resin film, whereby forming second contact hole patterns at positions of the plurality of first contact hole patterns selected by the selective opening pattern,
    wherein forming the selective opening pattern includes correcting a total effective light dose applied to the second photosensitive resin film so as to become equal among the plurality of types of the opening patterns, and wherein the plurality of second contact hole patterns have the same dimension irrespective of the plurality of types of the opening patterns.

4. The manufacturing method of a semiconductor device according to claim 3, wherein the first contact hole pattern is constituted of two line-and-space patterns perpendicular to each other.

5. The manufacturing method of a semiconductor device according to claim 3, wherein correcting the total effective light dose applied to the second photosensitive resin film includes correcting a dimension of the selective opening reticle pattern formed on a selective opening reticle used to form the selective opening pattern with respect to each of the plurality of types of the opening patterns.

6. The manufacturing method of a semiconductor device according to claim 3, wherein correcting the total effective light dose applied to the second photosensitive resin film includes performing multi-exposure by using a selective opening reticle pattern utilized to form the selective opening pattern and an auxiliary opening reticle pattern corresponding to each of the plurality of types of the opening patterns.

7. The manufacturing method of a semiconductor device according to claim 6, wherein an opening dimension of the auxiliary reticle pattern is smaller than an opening dimension of corresponding selective opening reticle pattern.

8. The manufacturing method of a semiconductor device according to claim 3, wherein correcting the total effective light dose applied to the second photosensitive resin film includes correcting a transmittance of the selective opening reticle pattern formed on a selective opening reticle used to form the selective opening pattern with respect to each of the plurality of types of the opening patterns.

9. The manufacturing method of a semiconductor device according to claim 3, wherein correcting the total effective light dose applied to the second photosensitive resin includes correcting minimum total effective light dose at an edge of the second contact hole pattern in each of the plurality of types of the opening patterns to be equal.

10. The manufacturing method of a semiconductor device according to claim 9, wherein correcting the total effective light dose applied to the second photosensitive resin film includes correcting a dimension of the selective opening reticle pattern formed on a selective opening reticle used to form the selective opening pattern with respect to each of the plurality of types of the opening patterns.

11. The manufacturing method of a semiconductor device according to claim 9, wherein correcting the total effective light dose applied to the second photosensitive resin film includes performing multi-exposure by using a selective opening reticle pattern utilized to form the selective opening pattern and an auxiliary opening reticle pattern corresponding to each of the plurality of types of the opening patterns.

12. The manufacturing method of a semiconductor device according to claim 11, wherein an opening dimension of the auxiliary reticle pattern is smaller than an opening dimension of corresponding selective opening reticle pattern.

13. The manufacturing method of a semiconductor device according to claim 9, wherein correcting the total effective light dose applied to the second photosensitive resin film includes correcting a transmittance of the selective opening reticle pattern formed on a selective opening reticle used to form the selective opening pattern with respect to each of the plurality of types of the opening patterns.

14. A reticle correcting method of forming a pattern, comprising:

using a first reticle including a contact hole reticle pattern to form a plurality of periodically arranged first contact hole patterns composed of a first photosensitive resin film on a processing film formed above a semiconductor substrate; and using a second reticle including a selective opening reticle pattern to selectively form a selective opening pattern composed of a second photosensitive resin film formed on the first photosensitive resin film and including a plurality of types of opening patterns so as to form a plurality of second contact hole patterns at positions corresponding to the plurality of first contact hole patterns selected by the selective opening patterns, wherein the contact hole reticle pattern or the selective opening reticle pattern is corrected with respect to each of the plurality of types of the selective opening patterns in such a manner that the plurality of second contact hole patterns are formed to have the same dimension.

15. The reticle correcting method according to claim 14, wherein correcting the selective opening reticle pattern includes correcting a dimension of the selective opening reticle pattern with respect to each of the plurality of types of selective opening patterns in such a manner that a minimum total effective light dose at an edge of the second contact hole pattern in each of the plurality of types of the opening patterns is to be equal among the plurality of types of the opening patterns.

16. The reticle correcting method according to claim 14, wherein correcting the selective opening reticle pattern includes correcting a transmittance of the selective opening reticle pattern with respect to each of the plurality of types of the opening patterns in such a manner that a minimum total effective light dose at an edge of the second contact hole pattern in each of the plurality of types of the opening patterns is to be equal among each of the plurality of types of the opening patterns.

17. A reticle pattern data correcting method comprising:

creating a test opening reticle having a plurality of types of opening reticle patterns that changes a light intensity of each of opening patterns on a photosensitive resin film and used to form the opening patterns to the photosensitive resin film;

forming periodically arranged first contact hole patterns composed of a first photosensitive resin film on a processing film formed above a semiconductor substrate;

forming a selective opening pattern composed of a second photosensitive resin film formed on the first photosensitive resin film by forming a plurality of types of opening patterns with different light intensities on the second photosensitive resin film with respect to each of the plurality of types of the opening reticle patterns using the test opening reticle, whereby forming a plurality of second contact hole patterns having different dimensions at positions corresponding to the plurality of the first contact hole patterns selected by the selective opening pattern;

measuring dimensions of the formed second contact hole patterns;

determining a second contact hole pattern with a dimension equal to a designed contact hole dimension with respect to each of the plurality of types of the opening patterns;

determining an opening reticle pattern corresponding to the determined second contact hole pattern with respect to each of the plurality of types of opening patterns; and correcting opening reticle pattern data based on the determined opening reticle patterns.

18. The reticle pattern data correcting method according to claim 17, wherein changing the light intensity includes changing a dimension of each of the opening reticle patterns.

19. The reticle pattern data correcting method according to claim 17, wherein changing the light intensity includes changing a transmittance of each of the opening reticle patterns.

20. The reticle pattern data correcting method according to claim 17, wherein changing the light intensity includes using an auxiliary opening reticle pattern to perform multi-exposure.

* * * * *